United States Patent [19]

Sasaki et al.

[11] Patent Number: 5,818,068
[45] Date of Patent: Oct. 6, 1998

[54] THIN FILM TRANSISTOR CIRCUIT AND AN ACTIVE MATRIX TYPE DISPLAY DEVICE

[75] Inventors: Osamu Sasaki; Manabu Matsuura; Tsukasa Shibuya, all of Tenri; Yasushi Kubota, Sakurai, all of Japan

[73] Assignee: Sharp Kabushiki Kaisha, Osaka, Japan

[21] Appl. No.: 531,626

[22] Filed: Sep. 21, 1995

[30] Foreign Application Priority Data

Sep. 22, 1994 [JP] Japan .................................. 6-228421
Aug. 14, 1995 [JP] Japan .................................. 7-207205

[51] Int. Cl.$^6$ .................................................. H01L 29/04
[52] U.S. Cl. ............................. 257/59; 257/67; 257/72
[58] Field of Search ............................ 257/72, 66, 59, 257/67

[56] References Cited

U.S. PATENT DOCUMENTS

| | | | |
|---|---|---|---|
| 5,481,121 | 1/1996 | Zhang et al. | 257/72 |
| 5,534,716 | 7/1996 | Takemura | 257/72 |
| 5,589,694 | 12/1996 | Takayama et al. | 257/67 |
| 5,604,360 | 2/1997 | Zhang et al. | 257/72 |
| 5,614,733 | 3/1997 | Zhang et al. | 257/72 |

FOREIGN PATENT DOCUMENTS

| | | |
|---|---|---|
| 261032 | 12/1990 | Japan . |
| 6244103 | 9/1994 | Japan . |

*Primary Examiner*—Mark V. Prenty
*Assistant Examiner*—Nathan K. Kelley

[57] ABSTRACT

A TFT circuit according to the present invention includes a first transistor and a second transistor both formed on an insulating substrate. The first transistor has a channel region comprising a polycrystalline silicon film to which a metal element for enhancing crystallization is added. The second transistor has a channel region comprising a polycrystalline silicon film to which no metal element for enhancing crystallization is added.

19 Claims, 18 Drawing Sheets

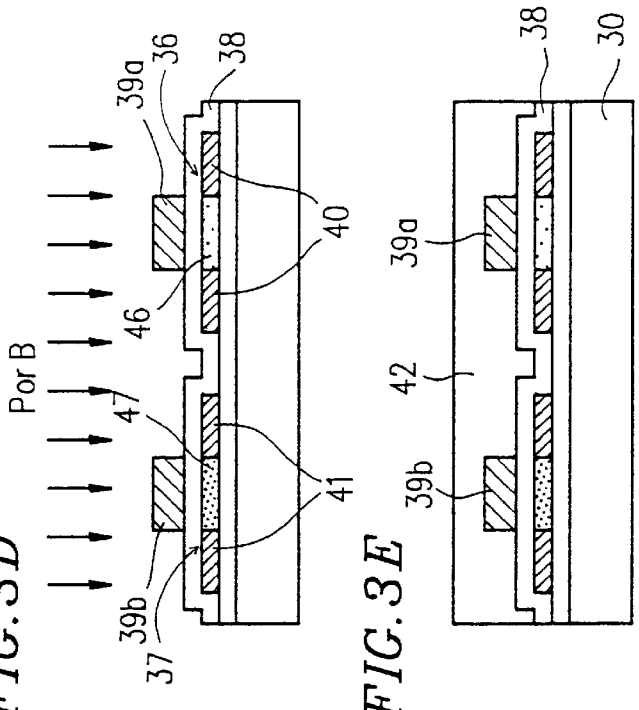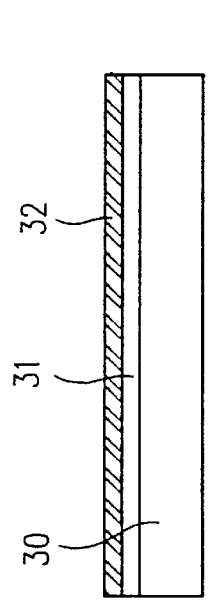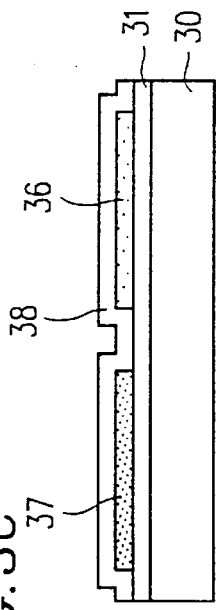
FIG.3A  FIG.3B  FIG.3C  FIG.3D  FIG.3E  FIG.3F

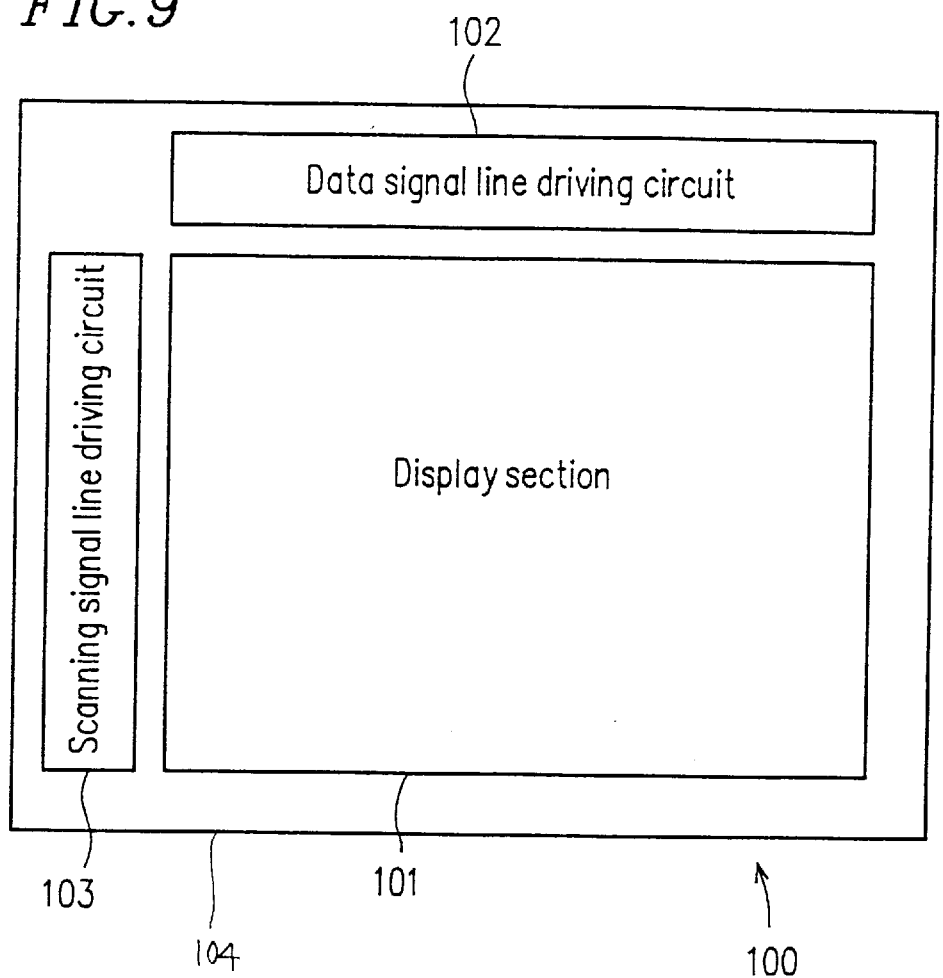

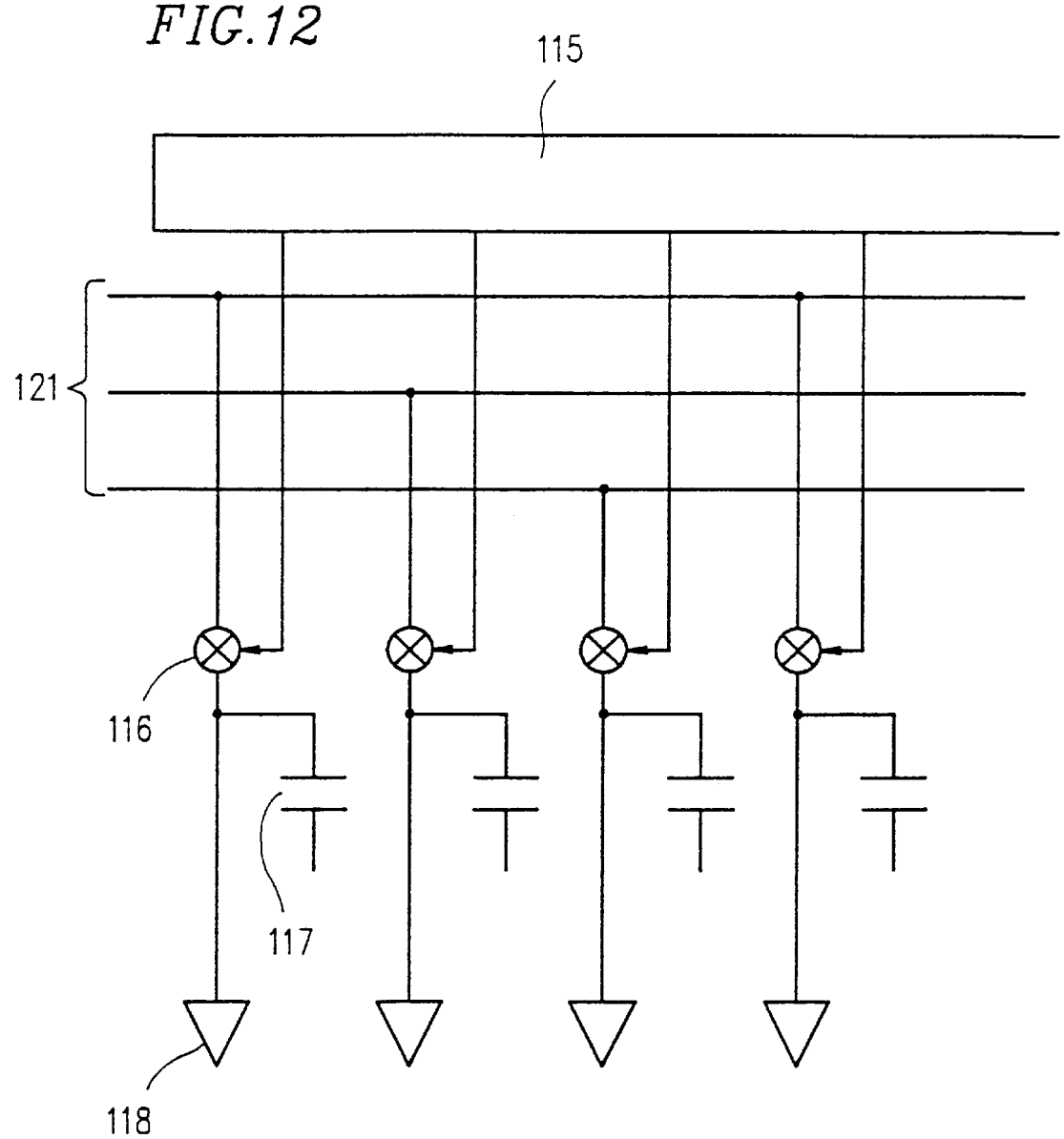

THIN FILM TRANSISTOR CIRCUIT AND AN ACTIVE MATRIX TYPE DISPLAY DEVICE

BACKGROUND OF THE INVENTION

1. Field of the Invention

The present invention relates to a thin film transistor (hereinafter referred to as a "TFT") and a high display-quality active matrix type display device incorporating the TFT.

2. Description of the Related Art

Currently, TFT circuits based on thin silicon films are being developed in various fields such as liquid crystal display devices, direct-contact type image sensor, and flash memories. Hereinafter, an active matrix type liquid crystal display device will be described as an example of a semiconductor device incorporating a driving circuit including TFTs formed on an insulating substrate as component elements.

Active matrix type liquid crystal display devices can be generally classified into the following categories: devices in which the TFTs of the driving circuit are composed of amorphous silicon films; and devices in which the TFTs of the driving circuit are composed of crystalline silicon films. Crystalline silicon films are classified into those which are formed by high temperature process and those which are formed by low temperature process. A crystalline silicon film which is obtained by high temperature process has crystallinity and mobility similar to those of a single crystal material. A crystalline silicon film which is obtained by low temperature process has a polycrystalline structure, so that it has a smaller carrier mobility than that of a crystalline silicon film obtained by high temperature process. In the case of a liquid crystal display device incorporating a glass substrate or the like, the heating temperature at which the substrate is to be heated inevitably requires the use of an amorphous silicon film or a polycrystalline silicon film obtained by low temperature process.

Many of the active matrix type liquid crystal display devices that are commercially available at present incorporate TFTs composed of amorphous silicon films (hereinafter referred to as "amorphous silicon TFTs"). However, in the case of a TFT type liquid crystal display device incorporating amorphous silicon TFTs, in general, circuitry other than the display section, e.g., the driver circuit, is required to be mounted outside as a driver LSI or the like because of the small carrier mobility of such TFTs. Therefore, there is a natural limit to the reduction of the production cost and the mounting density of the display device.

On the other hand, in the case of an active matrix type liquid crystal display device incorporating TFTs composed of polycrystalline silicon films (hereinafter referred to as "polycrystalline silicon TFTs"), the mobility of the TFTs can be increased relative to display devices incorporating amorphous silicon TFTs, so that the display section and the peripheral driving circuit can both be internalized on an insulating substrate in a monolithic manner. By adopting a monolithic configuration for the driving circuit, in particular, it becomes possible to reduce the production cost incurred by driver ICs and to accommodate minute pixel pitches which would not allow connection to the terminals of a driver IC. As a result, for example, small display devices having high-resolution can be realized. Therefore, vigorous research and development has been conducted for such a configuration; driver-monolithic type active matrix liquid crystal display devices incorporating polycrystalline silicon TFTs are expected to gain popularity.

FIG. 15 shows a configuration for a conventional active matrix type display device 200 incorporating amorphous silicon TFTs.

As shown in FIG. 15, the active matrix type display device 200 incorporating amorphous silicon TFTs includes the three following portions: a display section 200a formed on an insulating substrate 201a; a data signal line driving circuit 202 and a scanning signal line driving circuit 203 formed in the exterior of the insulating substrate 201a.

In the display section 200a, pixel capacitances 211 each composed of a liquid crystal capacitance 211a and a storage capacitance 211b are arranged on the insulating substrate 201a in a two-dimensional matrix of X-Y coordinates. For each pixel capacitance 211, a TFT 201 for controlling the writing and holding of data into the corresponding one of the pixel capacitances 211 is provided on the insulating substrate 201a. The TFTs 201 are either of a N channel type or a P channel type.

Since composing the elements in the scanning signal line driving circuit 203 and the data signal line driving circuit 202 of amorphous silicon results in insufficient mobility for driving the drivers, a data signal line driving circuit 202 and a scanning signal line driving circuit 203 whose component elements are composed of single-crystal silicon are provided in the exterior of the insulating substrate 201a.

FIG. 16 shows an exemplary configuration for a conventional active matrix type display device 220 incorporating polycrystalline silicon TFTs.

As shown in FIG. 16, the active matrix type display device 220 incorporating polycrystalline silicon TFTs includes a heat-resistant substrate. The display device 220 can accommodate higher mobility as compared with display devices incorporating amorphous silicon TFTs, so that a display section 221a and driving circuits such as a data signal line driving circuit 222 and a scanning signal line driving circuit 223 are all provided on an insulating substrate 220a in a monolithic manner without including any external circuitry.

The display device 220 has the same configuration as that of the display device 200 (FIG. 15) incorporating amorphous silicon TFTs except that TFTs 224 constituting pixel driving circuits in the display section 221a and the TFTs included in the data signal line driving circuit 222 and the peripheral driving circuitry such as the scanning signal line driving circuit 223 are all composed of photocrystaline silicon films. Each pixel capacitance 231 consists of a liquid crystal capacitance 231a and a storage capacitance 231b.

The data signal line driving circuit 222 will be described in more detail. Driving methods for data signal lines can be classified into a dot sequential driving method and a line sequential driving method.

According to the dot sequential driving method, as shown in FIG. 17, a start signal SPS is input to a scanning circuit 240 composed of shift registers and the like, and an output pulse obtained from each stage of the scanning circuit 240 is input to a buffer circuit 242. Each buffer circuit 242 retains and amplifies the output pulse it receives from the scanning circuit 240, and generates an inverted signal if necessary, and outputs a signal to a sample/hold circuit 248. As a result, each sample/hold circuit 248 is opened or closed in synchronization with the output pulse obtained from the corresponding stage of the scanning circuit 240, whereby an image signal DAT input to an image signal line 246 is written in a data signal line 250.

According to this method, a time period equivalent to only 1/(number of data lines) of an effective horizontal scanning period (which is about 80% of a horizontal scanning period) is allowed for the writing of the image signal DAT in the data signal line 250. This may result in insufficient writing (which causes deterioration of the display quality) in the case where the time constants of the data signal lines (i.e., a product of capacitance and resistance) increase as with the increase in the display size or in the case where a shorter sampling time is adopted in accordance with higher resolution. This problem is particularly pronounced when a sample/hold circuit is composed of transistors having a relatively small driving power, e.g., polycrystalline silicon TFTs, as described above. Therefore, in order to secure sufficient writing performance, the channel widths of the transistors included in the sample/hold circuit are increased.

On the other hand, according to the line sequential driving method, as shown in FIG. 18, the output of each sample/hold circuit 248 is coupled to a sample/hold circuit 256, to which a transfer signal 254 is input, and is further coupled to a data signal line via a signal amplifier 260. A sampling capacitance 252 is connected between the sample/hold circuit 248 and the sample/hold circuit 256; and a hold capacitance 258 is connected between the sample/hold circuit 256 and the signal amplifier 260. In accordance with such a configuration, an image signal DAT output from the sample/hold circuit 248 is temporarily stored in the sampling capacitance 252. The image signal DAT is transferred to the hold capacitance 258 via the sample/hold circuit 256 in the next horizontal scanning period, and output to the data signal line 250 via the signal amplifier 260.

Since the sampling capacitance 252 is generally smaller than the capacitance of the data signal line 250, the problem of insufficient writing associated with the dot sequential driving method is reduced. However, in order to prevent a charge retained in the sampling capacitance 252 from leaking to the sample/hold circuit 248 or 256 and to prevent the capacitance from being divided (which would reduce the charge) by the transfer of the data signal DAT to the hold capacitance 258, it is necessary to increase the capacitance of the sampling capacitance 252. This leads to a problem similar to the problem inherent to the dot sequential driving method. Consequently, in order to secure sufficient writing performance, the channel widths of the transistors included in the sample/hold circuit 248 must be increased.

In this case, too, a data signal written in the sampling capacitance 252 must be retained until the writing in the hold capacitance 258 is complete in accordance with a transfer signal, that is, approximately one horizontal scanning period at the most. Moreover, the data signal transferred to the hold capacitance 258 must also be retained until the writing in the data signal line 250 via the signal amplifier 260 is complete, that is, approximately one horizontal scanning period at the most.

The above-described conventional technique has the following problems:

A polycrystalline silicon TFT which is formed on a glass substrate by low temperature process has a much higher off-current ($I_{off}$) than that of an amorphous silicon TFT. As a result, various problems may arise if all the TFTs in the display device are composed only of polycrystalline silicon TFTs or of amorphous silicon TFTs.

For example, as the density of the display section increases so that the area of one pixel reduces, the impedance of the liquid crystal increases. This requires the off-resistance of the TFTs of the pixel driving circuits to be increased because, if the TFTs of the pixel driving circuits have a low off-resistance when the liquid crystal has a high impedance, data written in the pixel capacitance is immediately discharged via the TFTs as a leak current. However, the off-resistance of a polycrystalline silicon TFT is generally much lower than the off-resistance of an amorphous silicon TFT.

Therefore, if all the TFTs of a liquid crystal display device are composed of polycrystalline silicon TFTs, which allow high mobility, in an attempt to adopt a monolithic configuration for every driving circuit such as the pixel driving circuits in the display section, leak currents from the TFTs of the pixel driving circuits in the display section may cause display quality problems such as reduction of contrast, crosstalk, or uneven display.

It is contemplated that the TFTs of the pixel driving circuits in the display section can be composed of amorphous silicon TFTs, which have a higher off-resistance than that of polycrystalline silicon TFTs. However, the liquid crystal (which constitutes the pixel capacitances) has a leak resistance, so that the data charges stored in the pixel capacitances are discharged via the leak resistance of the liquid crystal. This also causes display quality problems such as reduction of contrast or flickering.

Prevention of the display quality deterioration seems possible by providing a buffer amplifier (as well as a sampling transistor) in each pixel driving circuit so as to construct a sample/hold circuit, thus compensating for the leak of charges discharged via the leak resistance of the liquid crystal. However, problems may arise due to the low driving power, relative to that of polycrystalline silicon TFTs, of amorphous silicon TFTs, and a low operation speed.

In other words, composing all the TFTs of a display device of amorphous silicon TFTs instead of polycrystalline silicon TFTs results in the problems of low mobility; impossibility to adopt a monolithic configuration for peripheral circuitry such as the driving circuits; and the lowering of the driving power thereof. On the other hand, composing all the TFTs of a display device of polycrystalline silicon TFTs invites various problems due to the large $I_{off}$ (i.e., large leak current) relative to that of amorphous silicon TFTs. For example, the TFTs of the pixel driving circuits in the display section may have a large leak current, thereby deteriorating the display quality.

Moreover, a polycrystalline silicon TFT has large dimensions, small carrier mobility, and a large leak current as compared with those of a single-crystal silicon transistor. Therefore, when reconstructing a circuit which has conventionally been composed of single-crystal silicon transistors by using polycrystalline silicon TFTs, the TFTs must be formed so as to have large channel widths in order to achieve substantially the same driving power achieved by single-crystal silicon transistors. However, increasing the channel width also increases the leak current.

A number of proposals have been made in order to solve the above-mentioned problems. For example, Japanese Patent Publication No. 2-61032 discloses a liquid crystal display device incorporating TFTs formed on an insulating substrate as component elements. This Patent Publication describes forming a polycrystalline silicon film or an amorphous silicon film on a transparent substrate (e.g., a glass substrate) and laser annealing only the regions near a display section where driving circuits and the like are formed, where high mobility is required. However, if an amorphous silicon film is formed on the transparent substrate of this device, the TFTs of the display section are composed of the amorphous silicon film, so that only a small driving power can be obtained in this portion; on the other hand, if a polycrystalline silicon film is formed on the transparent substrate of this device, the TFTs of the display section are composed of the polycrystalline silicon film, indicative of a large leak current occurring in this portion. As for the peripheral driving circuits, they will be composed of polycrystalline silicon TFTs whether an amorphous silicon film or a polycrystalline silicon film is formed on the transparent substrate. This results in a small off-resistance and a large leak current.

A method for improving the carrier mobility is known where metal elements such as nickel, iron, palladium and/or platinum are introduced into an amorphous silicon film so as to prompt the crystallization through catalytic action (e.g., Japanese Laid-Open Patent Publication No. 6-244103). This method also has the problem of an increased leak current, although it improves the carrier mobility.

SUMMARY OF THE INVENTION

A TFT circuit according to the present invention includes a first transistor and a second transistor both formed on an insulating substrate, the first transistor having a channel region composed essentially of a polycrystalline silicon film to which a metal element for enhancing crystallization is added, and the second transistor having a channel region composed essentially of a polycrystalline silicon film to which no metal element for enhancing crystallization is added.

In one embodiment of the invention, the TFT circuit includes static circuitry and dynamic circuitry, the static circuitry including at least one said first transistor, and the dynamic circuitry including at least one said second transistor.

In another embodiment of the invention, the TFT circuit is a data signal line driving circuit for providing a display section of a display device with image data, and the data signal line driving circuit includes a sample/hold circuit including at least one said second transistor and a circuit including at least one said first transistor.

In still another embodiment of the invention, the metal element for enhancing crystallization includes at least one selected from the group consisting of nickel (Ni), iron (Fe), cobalt (Co), palladium (Pd), and platinum (Pt).

An active matrix type display device according to the present invention includes: an insulating substrate; a plurality of pixels arranged in a matrix on the insulating substrate; and a data signal line driving circuit formed on the insulating substrate, the data signal line driving circuit driving the plurality of pixels. The data signal line driving circuit includes: a sample/hold circuit including a first transistor having a channel region composed essentially of a polycrystalline silicon film to which a metal element for enhancing crystallization is added; and a circuit including a second transistor having a channel region composed essentially of a polycrystalline silicon film to which no metal element for enhancing crystallization is added.

Alternatively, the active matrix type display device according to the present invention includes: an insulating substrate; a plurality of pixels arranged in a matrix on the insulating substrate; and a data signal line driving circuit formed on the insulating substrate, the data signal line driving circuit driving the plurality of pixels. The data signal line driving circuit includes: a sample/hold circuit including a first transistor having a channel region composed essentially of a polycrystalline silicon film to which a metal element for enhancing crystallization is added; and a circuit including a second transistor having a channel region composed essentially of a polycrystalline silicon film to which no metal element for enhancing crystallization is added.

In one embodiment of the invention, the metal element for enhancing crystallization includes at least one selected from the group consisting of nickel (Ni), iron (Fe), cobalt (Co), palladium (Pd), and platinum (Pt).

A semiconductor device according to the present invention includes a plurality of driving circuits for driving pixels of an active matrix type display device, the driving circuit being formed on an insulating substrate, wherein each of the plurality of pixel driving circuits includes a plurality of TFTs including at least a TFT composed of an amorphous silicon film and at least a TFT composed of a polycrystalline silicon film, the amorphous silicon film and the polycrystalline silicon film being formed on the insulating substrate.

In one embodiment of the invention, the TFT composed of an amorphous silicon film supplies a signal that is input to one of a source terminal or a drain terminal of the TFT to a signal input terminal of another element as a voltage or a current via the other one of the source terminal or the drain terminal in accordance with a gate signal that is input to a gate terminal of the TFT.

In another embodiment of the invention, each of the plurality of driving circuits includes a logic circuit and a buffer circuit, the logic circuit and buffer circuit including the TFT composed of a polycrystalline silicon film.

In still another embodiment of the invention, each of the plurality of pixel driving circuits includes a sample/hold circuit which has a sampling circuit including the TFT composed of an amorphous silicon film and a buffer circuit including the TFT composed of a polycrystalline silicon film, and wherein the TFT composed of an amorphous silicon film receives an image signal via one of a source terminal or a drain terminal thereof, and the other one of the source terminal or the drain terminal is coupled to a signal input terminal of the buffer and a capacitance for retaining the image signal.

In still another embodiment of the invention, the polycrystalline silicon film is obtained by selectively introducing a metal element into a portion of an amorphous silicon film and allowing crystal to grow from the portion in directions substantially parallel to a surface of the insulating substrate by heating.

In still another embodiment of the invention, the TFT composed of the polycrystalline silicon film is formed in such a manner that the directions in which the crystal grows are substantially parallel to a direction in which carriers in the polycrystalline silicon film move.

In still another embodiment of the invention, the metal element for enhancing crystallization includes at least one selected from the group consisting of nickel (Ni), iron (Fe), cobalt (Co), palladium (Pd), and platinum (Pt).

In still another embodiment of the invention, the semiconductor device is included in an active matrix type liquid crystal display device.

Alternatively, the semiconductor device according to the present invention includes a peripheral driving circuit for supplying a signal to a display section of an active matrix type display device, the peripheral driving circuit being formed on an insulating substrate, wherein the peripheral driving circuit includes a plurality of TFTs including at least a TFT composed of an amorphous silicon film and at least a TFT composed of a polycrystalline silicon film, the amorphous silicon film and the polycrystalline silicon film being formed on the insulating substrate.

In one embodiment of the invention, the TFT composed of an amorphous silicon film supplies a signal that is input to one of a source terminal or a drain terminal of the TFT to a signal input terminal of another element as a voltage or a current via the other one of the source terminal or the drain terminal in accordance with a gate signal that is input to a gate terminal of the TFT.

In another embodiment of the invention, the driving circuit includes a logic circuit and a buffer circuit, the logic circuit and buffer circuit including the TFT composed of a polycrystalline silicon film.

In still another embodiment of the invention, the peripheral driving circuit includes a data signal line driving circuit which has a scanning circuit including the TFT composed of a polycrystalline silicon film and an analog switch including the TFT composed of an amorphous silicon film, and the TFT composed of the amorphous silicon film receives an image signal via one of a source terminal or a drain terminal thereof, the other one of the source terminal or the drain terminal being coupled to a capacitance for retaining the image signal.

In still another embodiment of the invention, the polycrystalline silicon film is obtained by selectively introducing a metal element into a portion of an amorphous silicon film and allowing crystal to grow from the portion in directions substantially parallel to a surface of the insulating substrate by heating.

In still another embodiment of the invention, the TFT composed of the polycrystalline silicon film is formed in such a manner that the directions in which the crystal grows are substantially parallel to a direction in which carriers in the polycrystalline silicon film move.

In still another embodiment of the invention, the metal element for enhancing crystallization includes at least one selected from the group consisting of nickel (Ni), iron (Fe), cobalt (Co), palladium (Pd), and platinum (Pt).

In still another embodiment of the invention, the semiconductor device is included in an active matrix type liquid crystal display device.

Thus, the invention described herein makes possible the advantages of (1) providing a TFT circuit with excellent characteristics including circuitry which is required to have a high operation speed or driving power, and circuitry which is required to have good retention characteristics; (2) providing a display device with high display performance by applying the TFT circuit to a driving circuit for the display device; (3) realizing a monolithic configuration for, for example, pixel driving circuits in a display section and peripheral driving circuits provided on a single insulating substrate; and (4) providing a liquid crystal display device in which pixel driving circuits corresponding to respective pixels of a display section have a small leak current and a high driving power. In other words, the present invention makes possible the advantage of providing a high-performance display device which cannot be obtained by using polycrystalline silicon TFTs only or amorphous silicon TFTs only.

These and other advantages of the present invention will become apparent to those skilled in the art upon reading and understanding the following detailed description with reference to the accompanying figures.

BRIEF DESCRIPTION OF THE DRAWINGS

FIGS. 3A to 3F are cross-sectional views describing a method for producing a TFT circuit according to the present invention.

FIG. 9 is a schematic diagram showing the configuration of an active matrix type liquid crystal display device according to another example of the present invention.

FIG. 12 is an equivalent circuit diagram showing a dot sequential sampling type data signal line driving circuit as opposed to the exemplary line sequential sampling type data signal line driving circuit according to an example of the present invention.

DESCRIPTION OF THE PREFERRED EMBODIMENTS (EXAMPLE 1)

Hereinafter, examples of the present invention will be described with reference to the accompanying figures.

Figure 1:
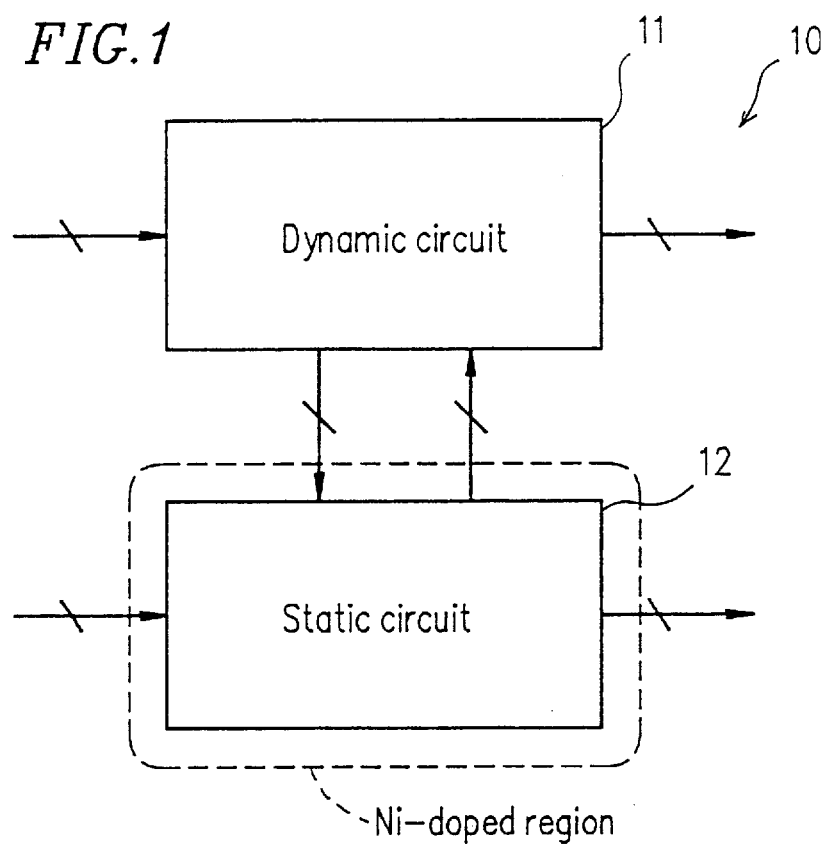
FIG. 1 is a block diagram showing a TFT circuit according to the present invention.

FIG. 1 is a block diagram showing a TFT circuit 10 according to the present invention. The TFT circuit 10 is composed of a plurality of circuits including a dynamic circuit 11 and a static circuit 12, as described below. The static circuit 12 is formed on an insulating substrate. The static circuit 12 includes a plurality of TFTs each having a channel region composed of a polycrystalline silicon film to which a metal element for enhancing crystallization is added. The dynamic circuit 11 is formed on an insulating substrate. The dynamic circuit 11 includes a TFT having a channel region composed of a polycrystalline silicon film including no metal elements for enhancing crystallization.

When no signal is input to the dynamic circuit 11, i.e., when a node in the circuit is in a floating state, the dynamic circuit 11 functions so as to retain data that was input immediately before. A NAND (negative logic product) circuit 13 shown in FIG. 2A, which has two inputs, is an example of the dynamic circuit 11. In the NAND circuit 13, logic signals X and Y are input to terminals 15 and 16 in synchronization with a clock signal C which is input to a terminal 14, i.e., when the clock signal C is at a high level.

In other words, when the logic signals X and Y are not input, the clock signal C is at the high level, so that a terminal 17 is floating and therefore retains a state it was at immediately before; for example, if the terminal 17 was outputting a high level signal in the state immediately before, that state is retained. Then, immediately before the logic signals X and Y are input, the clock signal C falls to a low level once, so that a high level signal is output through the terminal 17. Thereafter, as the clock signal rises back to the high level, the logic signals X and Y are input to the terminals 15 and 16, respectively, so that an output signal Z which is in accordance with the logic signals X and Y is output through the terminal 17. For example, if the logic signals X and Y are both at the high level, the signal Z from the terminal 17 is at the low level. If at least one of the logic signals X and Y is at the low level, the terminal 17 remains floating, so that the state immediately before is retained, e.g., so as to output a high level signal.

Figure 2A:
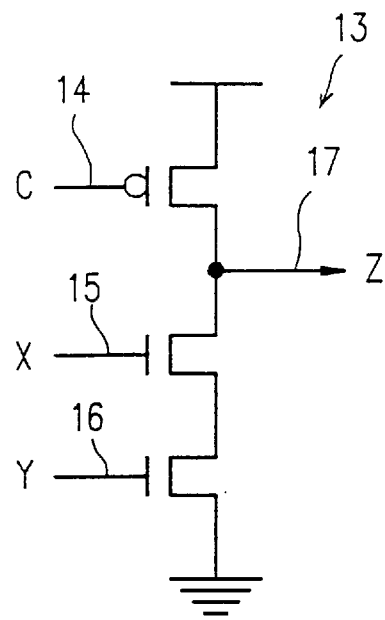
FIG. 2A is a circuit diagram showing an exemplary dynamic circuit.
Figure 2B:
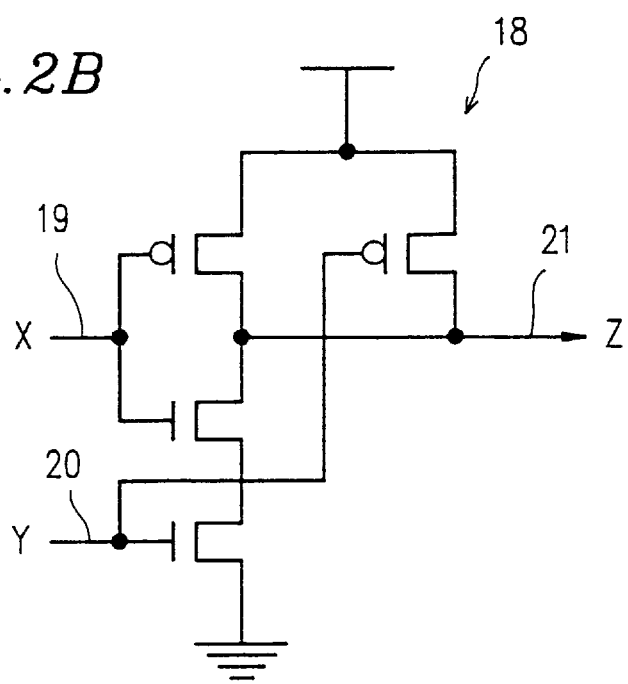
FIG. 2B is a circuit diagram showing an exemplary static circuit.

On the other hand, a signal is always input to the static circuit 12, so that all the nodes therein are stably at the high level or the low level. a NAND circuit 18 shown in FIG. 2B, which has two inputs, is an example of the static circuit 12. In the NAND circuit 18, a p-type transistor and an n-type transistor are connected to terminals 19 and 20, respectively, so that one of the transistors always operates whether the input signals X and Y are at the low level or the high level. Accordingly, a terminal 21 is coupled to a power line which is always at the high level or at the low level, so that an output signal Z is stabilized at the high level or the low level.

In a dynamic circuit such as the NAND circuit 13 shown in FIG. 2A, the output node Z is floating and therefore retains the high level when at least one of the input signals X and Y is at the low level as described above. Therefore, the output signal may possibly be inverted if the transistor has a large leak current. Accordingly, it is necessary to use transistors having only a small leak current (off-current), i.e., high retention characteristics, in the case of a dynamic circuit.

In a static circuit such as the NAND circuit 18 shown in FIG. 2B, all the nodes are always coupled to one of the power lines, so that the signal is prevented from being inverted even when there is a small leak current. Accordingly, it is preferable to use transistors having higher driving power so as to realize a high speed operation. Alternatively, instead of increasing the operation speed, it is preferable to use smaller transistors in order to reduce the scale of the circuit.

Therefore, in terms of whether the operation speed or the retention characteristics should receive priority, it can be said that static circuits primarily require higher operation speed, whereas dynamic circuits primarily require higher retention characteristics.

The present invention employs two different polycrystalline silicon TFTs for the two kinds of circuits (i.e., dynamic circuits and static circuits) thus requiring priority on different properties, which are included in a TFT circuit. When forming a polycrystalline silicon film by subjecting an amorphous silicon film to a heat treatment, it is possible to prompt the crystallization of the silicon film by adding metal elements which enhance crystallization, e.g., nickel, to the amorphous silicon film. As a result of this, a polycrystalline silicon film having a high polycrystallinity can be obtained. Such a polycrystalline silicon film has a high carrier mobility, so that it has excellent high-speed operation characteristics and driving power as compared to the characteristics of a polycrystalline silicon film to which no such metal elements are added. On the other hand, a polycrystalline silicon film to which no metal elements are added have a smaller leak current and better off-current characteristics than the characteristics of a polycrystalline silicon film to which a metal element is added.

Therefore, by employing TFTs having channel regions composed of polycrystalline silicon films to which a metal elements for enhancing crystallization is added in those portions of a TFT circuit which primarily require a high operation speed (hereinafter, such a portion or circuitry will be referred to as an "operation speed-requiring portion" or "operation speed-requiring circuitry"), it becomes possible to improve the performance of the entire TFT circuit. Similarly, by employing TFTs having channel regions composed of polycrystalline silicon films to which no metal elements for enhancing crystallization are added in those portions of the TFT circuit which primarily require high retention characteristics (hereinafter, such a portion or circuitry will be referred to as a "retention characteristics-requiring portion" or "retention characteristics-requiring circuitry"), it becomes possible to improve the retention characteristics of the entire TFT circuit.

The above-described TFT circuit is produced as follows, for example:

As shown in FIG. 3A, a silicon oxide film 31 is formed as a contamination prevention film for preventing contamination due to diffusion of impurities such as alkaline metals, on an insulating substrate 30, e.g., a glass substrate. Next, an amorphous silicon film 32 is deposited on the silicon oxide film 31.

As shown in FIG. 3B, a mask layer 33 is provided on the amorphous silicon film 32 so as to cover a region in which transistors for retention characteristics-requiring circuitry. FIG. 3B illustrates that the transistors for retention characteristics-requiring circuitry are formed in a region 34, while the transistors for operation speed-requiring circuitry are formed in a region 35. However, the regions 34 and 35 can be at a distance from each other, instead of adjoining each other as in the figure. Moreover, the regions 34 and 35 can each be divided into a plurality of subregions. Furthermore, the amorphous silicon film 32 does not need to be continuous; the regions 34 and 35 can be separated by etching or the like. There are no particular limits to the pattern size of the mask layer 33; the region 34 or 35 can be of a size defining only one TFT, or of a size defining a region corresponding to a plurality of transistors.

By using the mask layer 33 as a mask, a metal element capable of enhancing crystallization is introduced into the amorphous silicon film 32. Examples of the method of introducing such metal elements include sputtering or application of a solution in which a metal complex is dissolved. As the metal element having catalytic action capable of enhancing crystallization, nickel, iron, cobalt, palladium, platinum, or the like can be used (hereinafter, such metal elements will be referred to as "crystallization-enhancing metal elements").

After removing the mask layer 33, the amorphous silicon film 32 is polycrystallized by subjecting the amorphous silicon film 32 to a heat annealing at a temperature in the range of 550° C. to 600° C. or to an annealing using an excimer laser. It is also applicable to perform the heat annealing and the annealing using an excimer laser at the same time. Thus, as shown in FIG. 3C, a polycrystalline silicon film 37 to which a crystallization-enhancing metal element is added and a polycrystalline silicon film 36 which includes no crystallization-enhancing metal elements are formed. Thereafter, the respective films are etched in accordance with the desired transistor shapes. Then, a gate insulating film 38 composed of a silicon oxide film or the like is formed so as to cover the polycrystalline silicon films 36 and 37.

As shown in FIG. 3D, gate electrodes 39a and 39b composed of aluminum, tantalum, etc., are formed on the gate insulating film 38. By using the gate electrodes 39a and 39b as a mask, phosphorus (in the case of an n-channel type transistor) or arsenic (in the case of a p-channel type transistor) is implanted into the polycrystalline silicon films 36 and 37 in a self-matching manner. Thus, source/drain regions 40 and 41 of transistors are formed in the polycrystalline silicon films 36 and 37, respectively. By this process, channel regions 46 and 47 are formed in portions of the polycrystalline silicon films 36 and 37 below the gate electrodes 39a and 39b. If necessary, hydrogen ions are subsequently implanted into the channel regions 46 and 47 by conducting a hydrogenation process.

Thereafter, as shown in FIG. 3E, an interlayer insulating film 42 composed of a silicon oxide film, a silicon nitride film, or the like is deposited on the gate insulating film 38 so as to cover the gate electrodes 39a and 39b. After forming contact holes in the interlayer insulating film 42 so as to expose portions of the source/drain regions 40 and 41, metal wires 43 (composed of aluminum or the like) are formed so as to be connected to the source/drain regions 40 and 41.

Thus, a TFT circuit has been completed which includes a transistor 45 having a channel region composed of the polycrystalline silicon film 37, to which a crystallization-enhancing metal element is added and a transistor 44 having a channel region composed of the polycrystalline silicon film 36, to which no crystallization-enhancing metal elements are added.

In the above production method, a metal element having catalytic action capable of enhancing crystallization over the entire amorphous silicon film 32, which becomes the polycrystalline silicon film 38, is introduced. However, the following method can alternatively be used.

Figure 4A:
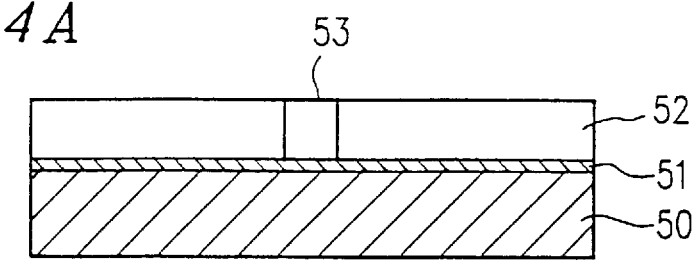
FIGS. 4A to 4B are cross-sectional views describing another method for producing a TFT circuit according to the present invention.

As shown in FIG. 4A, an amorphous silicon film 52 is formed on a substrate 50 with a silicon oxide film 51 interposed therebetween. Thereafter, a metal element having catalytic action capable of selectively enhancing crystallization over only a region 53 of the amorphous silicon film 52 is introduced. In this case, it is preferable to introduce the metal element at a concentration higher than in the above method.

Figure 4B:
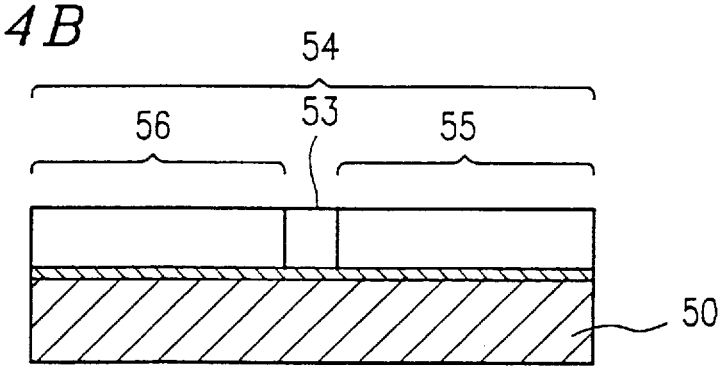

Thereafter, as shown in FIG. 4B, a heat treatment similar to that described in the above method is conducted, whereby a polycrystalline silicon film 54 is formed. In this process, the crystallization begins in the region 53, and the introduced metal element diffuses across (i.e., in a lateral direction with respect to) the substrate 50 as the crystals grow. As a result, the metal element is contained in not only the region 53, but also regions 55 and 56. Thereafter, a TFT can be formed having a portion of the region 55 or 56 as a channel region, which result in transistors having channel regions composed of polycrystalline silicon films to which the crystallization-enhancing metal element is added.

As will be understood from the above description, the TFT circuit according to the present invention includes a transistor having a high carrier mobility and a transistor having only a small leak current. Therefore, it is possible to select either one of the two kinds of transistors depending on the specific transistor characteristics required for each block of the entire circuitry. Thus, the characteristics of the circuitry as a whole can be improved. Moreover, the two kinds of transistors are formed substantially simultaneously, so that the production process is no more complicated than in the case of producing only one kind of transistor. Furthermore, there are no particular limits as to the locations where the two kinds of transistors are provided; different kinds of transistors may adjoin each other.

Hereinafter, an exemplary circuit to which the TFT circuit of the present is applied will be described.

Figure 5:
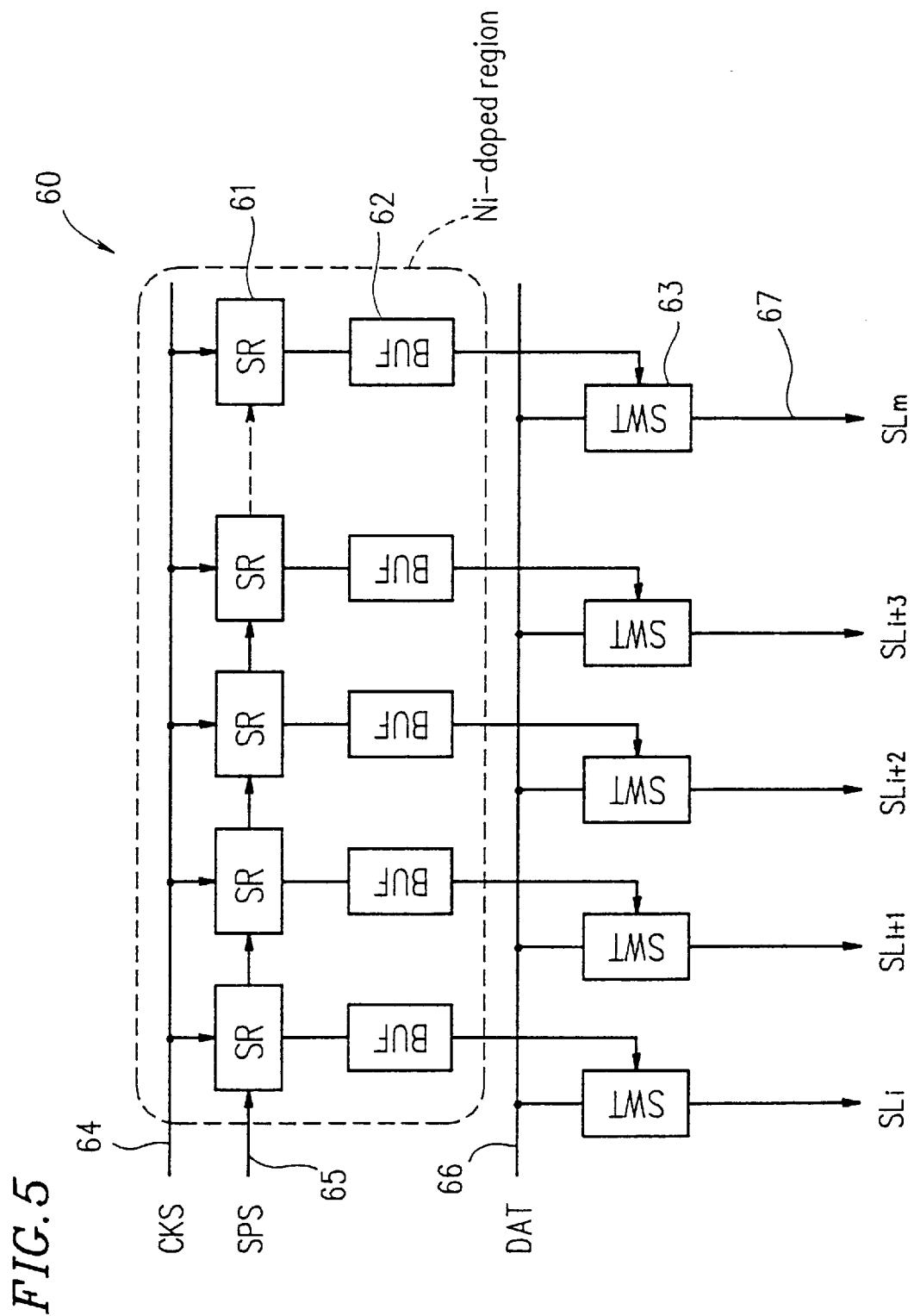
FIG. 5 is a block diagram showing a data signal line driving circuit as an example of a TFT circuit according to the present invention.

FIG. 5 shows a portion of a data signal line driving circuit 60 of a dot sequential driving type, which is used for display devices such as liquid crystal display devices.

The data signal line driving circuit 60 includes a scanning circuit 61 (composed of shift registers and the like) connected to a clock signal line 64 and a start signal line 65, a buffer circuit 62 connected to each output stage of the scanning circuit, and a sample/hold circuit 63 connected to the output of each buffer circuit 62. The sample/hold circuits 63 are coupled to an image signal line 66.

Output pulses obtained from the respective stages of the scanning circuit 61 in accordance with a clock signal CKS applied to the clock signal line 64 and a start signal SPS applied to a start signal line 65 are input to the buffer circuits 62. The buffer circuits 62 retain and amplify the output pulses (sampling signals) they receive from the scanning circuit 61, and generate inverted signals if necessary, and output signals to the sample/hold circuits 63. As a result, each sample/hold circuit 63 is opened or closed in synchronization with the output pulse obtained from the corresponding stage of the scanning circuit 61, whereby an image signal DAT input to the image signal line 66 is written in a data signal line 67.

The sample/hold circuits 63 are required to have high retention characteristics because it is required to retain the image signal DAT for, at the most, one horizontal scanning period. On the other hand, the scanning circuit 61 composed of shift registers and the like is required to have a high operation speed in order to generate satisfactory sampling signals. Therefore, according to the present invention, the sample/hold circuits 63 are composed of TFTs having channel regions composed of polycrystalline silicon films to which no crystallization-enhancing metal elements are added, whereas the scanning circuit 61 and the buffer circuits 62 are composed of TFTs having channel regions composed of polycrystalline silicon films to which a crystallization-enhancing metal element is added.

Thus, the present invention employs the two different kinds of TFTs having different characteristics for two kinds of circuits which are required to have different characteristics. As a result, the performance of the entire data signal line driving circuit 70 can be improved, whereby high-quality display is achieved.

Figure 6:
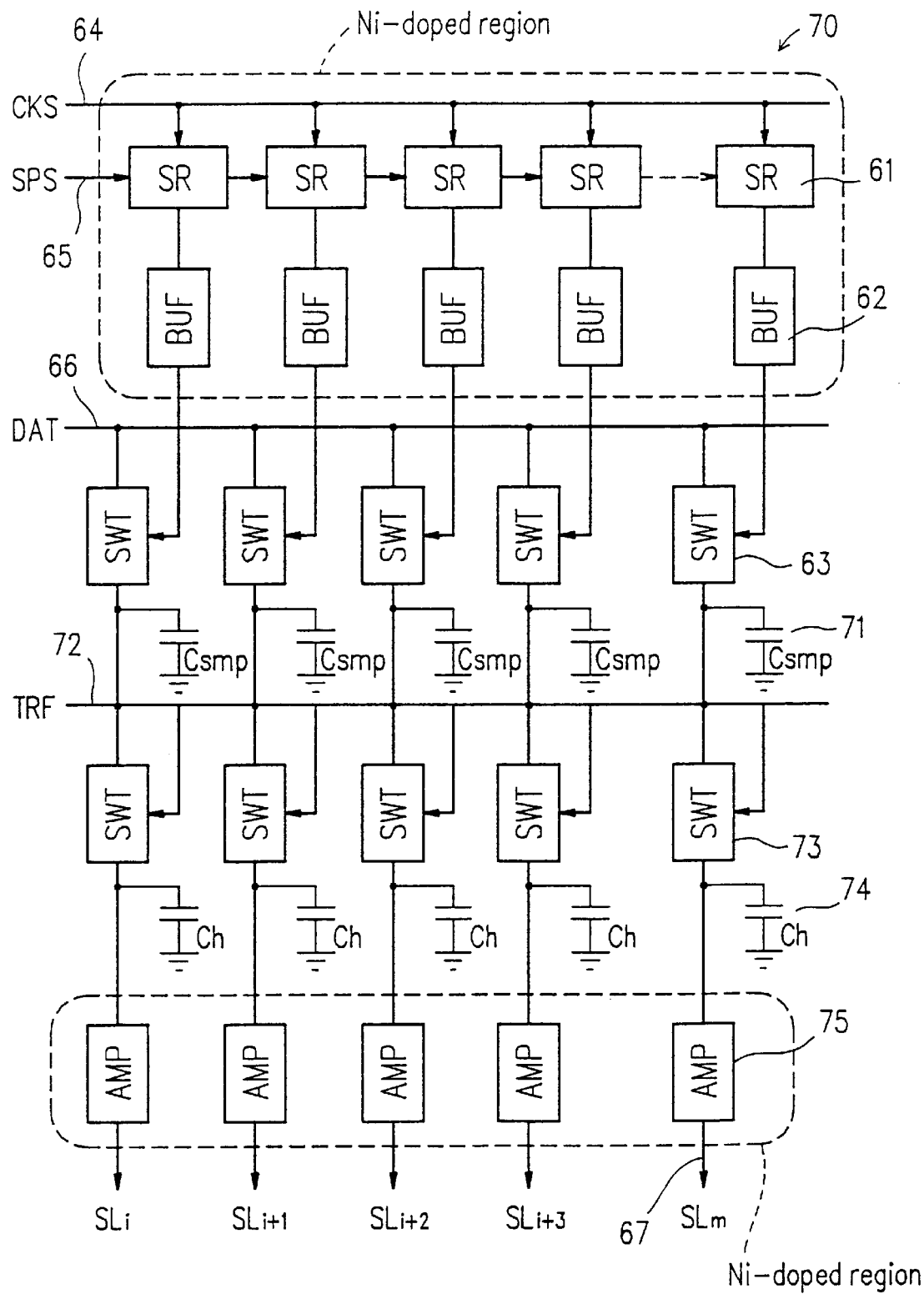
FIG. 6 is a block diagram showing a data signal line driving circuit as another example of a TFT circuit according to the present invention.

FIG. 6 shows a portion of a data signal line driving circuit 70 of a line sequential driving type, which is used for display devices such as liquid crystal display devices.

In accordance with the data signal line driving circuit 70, in addition to the construction of the data signal line driving circuit 60, each output of a sample/hold circuit 63 is coupled to a sample/hold circuit 73 (which is coupled to a transfer signal line 72) and is coupled to a data signal line 67 via a signal amplifier 75. A sampling capacitance 71 is connected between each sample/hold circuit 63 and the corresponding sample hold circuit 73; a hold capacitance 74 is connected between each sample hold circuit 73 and the corresponding signal amplifier 75. In accordance with the above configuration, an image signal DAT output from each sample/hold circuit 63 is temporarily stored in the corresponding sampling capacitance 71. The image signal DAT is transferred to the corresponding hold capacitance 74 via the sample/hold circuit 73 in the next horizontal scanning period, and output to a data signal line 67 via the signal amplifier 75.

The sample/hold circuits 63 and 73 are required to have high retention characteristics because they are required to retain the image signal DAT for, at the most, one horizontal scanning period. On the other hand, the scanning circuit 61 composed of shift registers and the like is required to have a high operation speed in order to generate satisfactory sampling signals. Moreover, the signal amplifiers 75 for outputting an image signal to the data signal lines 67 are required to have a high driving power because they charge/discharge large capacitances (i.e., the data signal lines 67). Therefore, according to the present invention, the sample/hold circuits 63 and 73 are composed of TFTs having channel regions composed of polycrystalline silicon films to which no crystallization-enhancing metal elements are added, whereas the scanning circuits 61, the buffer circuits 62, and the signal amplifiers 75 are composed of TFTs having channel regions composed of polycrystalline silicon films to which a crystallization-enhancing metal element is added.

Thus, the present invention employs the two different kinds of TFTs having different characteristics for two kinds of circuits which are required to have different characteristics. As a result, the performance of the entire data signal line driving circuit 70 can be improved, whereby high-quality display is achieved.

Figure 7:
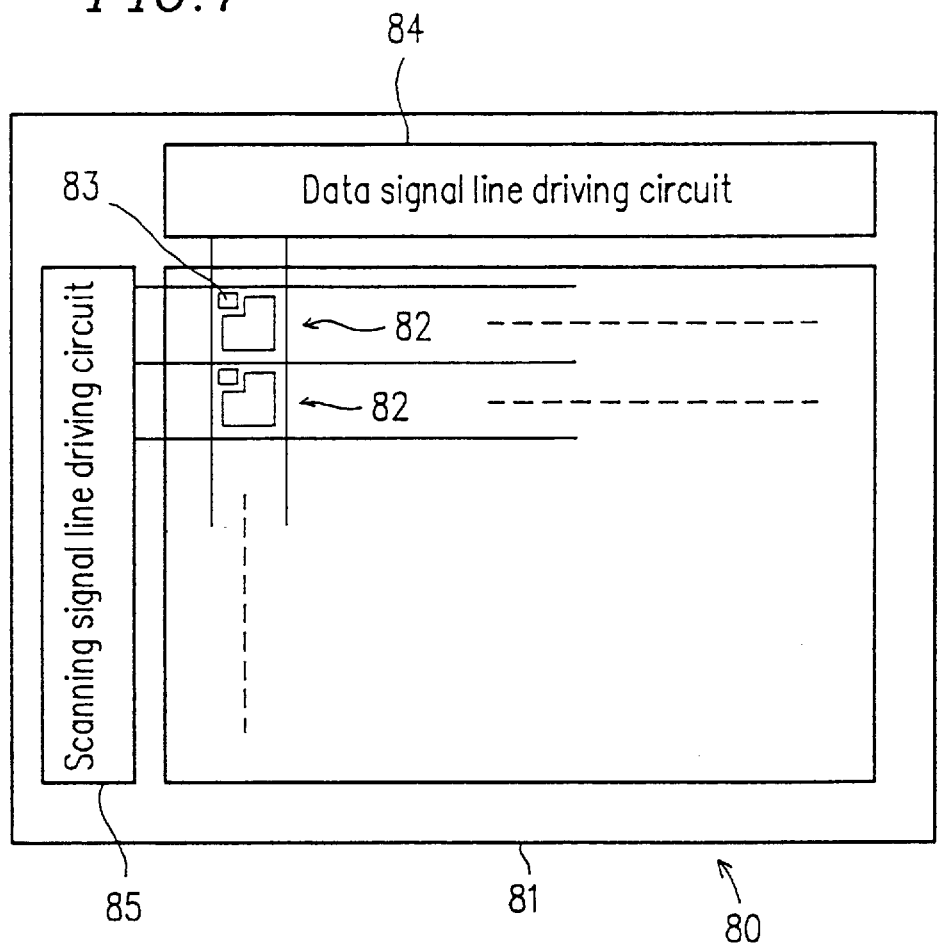
FIG. 7 is a schematic diagram describing the configuration of a liquid crystal display device as an example of the display device according to the present invention.

The data signal line driving circuits 60 and 70 each (described with reference to FIGS. 5 and 6, respectively) can be suitably used for a liquid crystal display device. As shown in FIG. 7, a plurality of pixels 82 are arranged in a matrix shape on an insulating substrate 81 of a liquid crystal display device 80. A data signal line driving circuit 84 and a scanning signal line driving circuit 85 for driving the pixels 82 are formed on the insulating substrate 81. Each pixel 82 includes a TFT 83 as a switching element. The pixel 82 is connected to the data signal line driving circuit 84 and the scanning signal line driving circuit 85 via the TFT 83.

The data signal line driving circuit 84 has a structure similar to that of the data signal line driving circuit 60 or 70 shown in FIG. 5 or 6. The TFTs of the data signal line driving circuit 84 and the scanning signal line driving circuit 85 are formed on the insulating substrate 81 by the same process by which the TFTs 83 of the pixels 82 are produced. In accordance with this configuration, a low-cost and highly reliable liquid crystal display device can be realized.

Figure 8A:
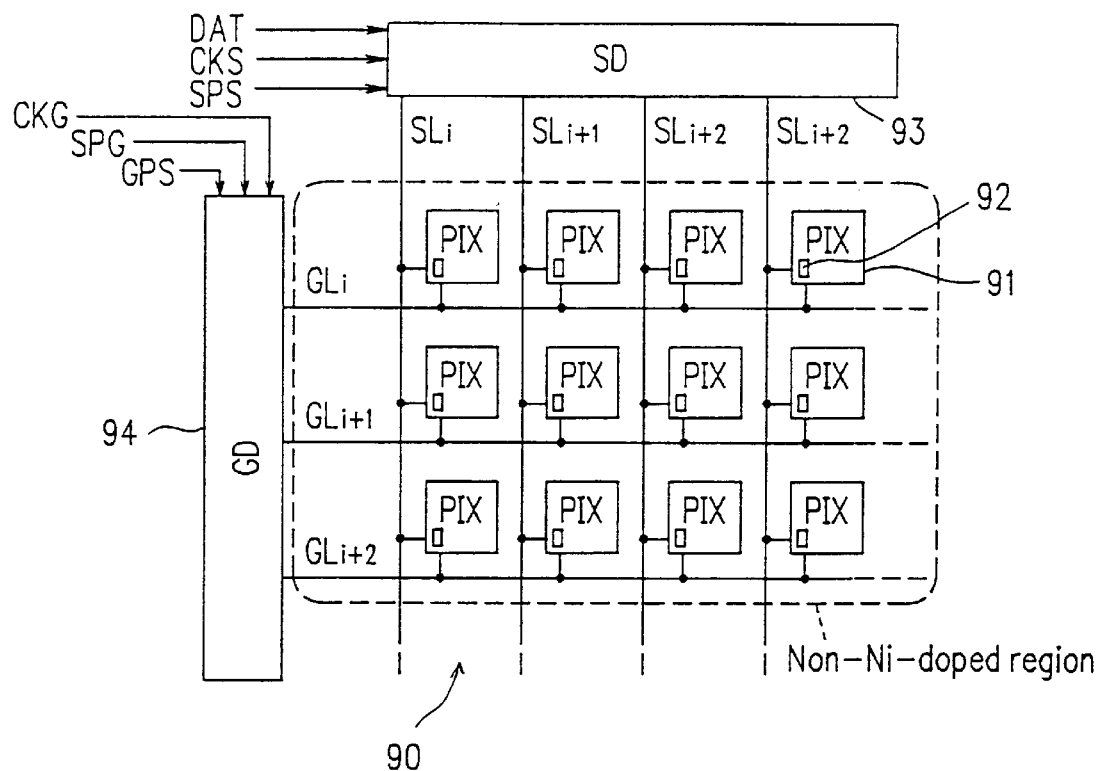
FIGS. 8A and 8B are block diagrams showing another example of the display device according to the present invention.
Figure 8B:
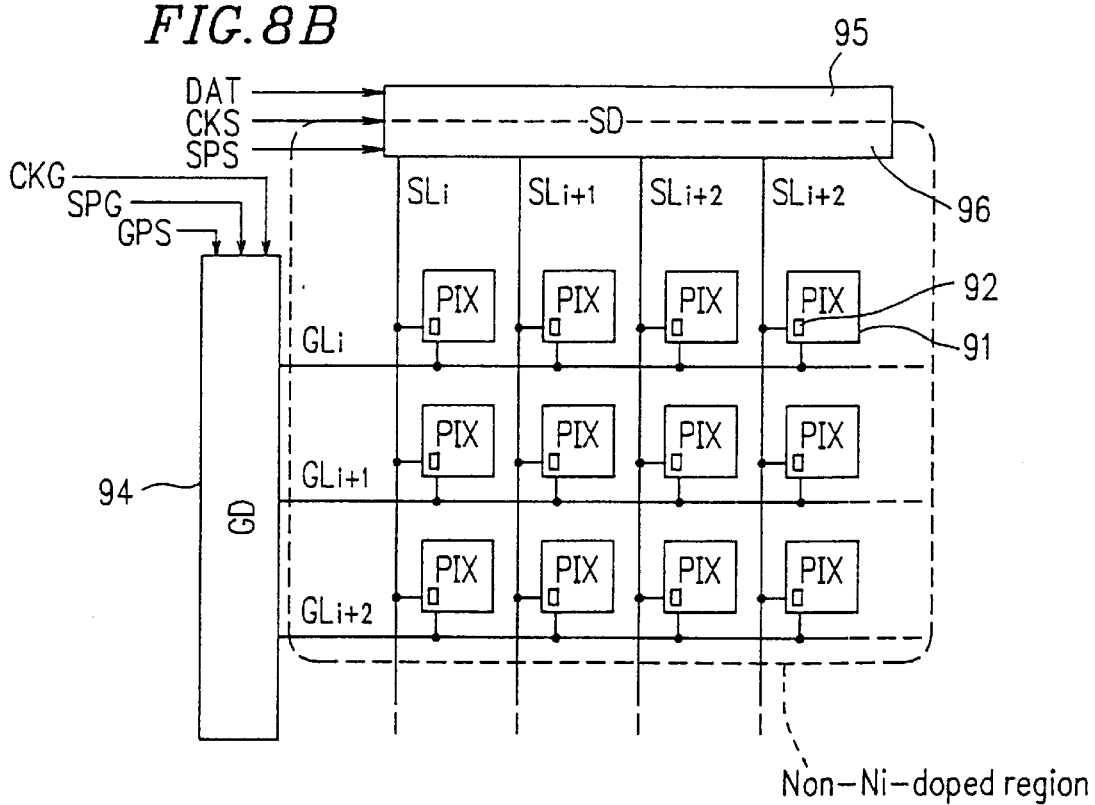

FIGS. 8A and 8B are block diagrams describing a still another exemplary liquid crystal display device 90 according to the present invention.

As shown in FIG. 8A, TFTs 92 for switching pixels 91 are required to have very high retention characteristics because they are required to retain an image signal for one frame period. On the other hand, a data signal line driving circuit 93 and a scanning signal line driving circuit 94 are required to have a high driving power because they drive relatively large loads. Therefore, according to the present invention, the TFTs 92 of the pixels 91 are composed of TFTs having channel regions composed of polycrystalline silicon films to which no crystallization-enhancing metal elements are added, whereas the data signal line driving circuit 93 and the scanning signal line driving circuit 94 are composed of TFTs having channel regions composed of polycrystalline silicon films to which a crystallization-enhancing metal element is added. Thus, both of the above requirements are met. As a result, the writing and retention of an image signal in the pixels 91 can be achieved with high accuracy, whereby a liquid crystal display device capable of high-quality display is obtained.

As described above, sample/hold circuits included in a data signal line driving circuit are required to have relatively high retention characteristics, if not as high as those required by the TFTs of pixels. Therefore, depending on the characteristics of the transistors, it is preferable that the TFTs of the sample/hold circuits have channel regions composed of polycrystalline silicon films to which no crystallization-enhancing metal elements are added.

In the above case, as shown in FIG. 8B, the transistors of a sample/hold circuit 96 of a data signal line driving circuit 95 and TFTs 92 included in pixels can be composed of TFTs having channel regions composed of polycrystalline silicon films to which no crystallization-enhancing metal elements are added. Thus, both of the above requirements are met. As a result, the writing and retention of an image signal in the pixels can be achieved with high accuracy, whereby a liquid crystal display device capable of high-quality display is obtained.

As will be appreciated, the present invention can be broadly applied to TFTs for various purposes, in addition to TFT circuits used for liquid crystal display devices, which include circuitry which require high speed operation and high driving power and circuitry which require high retention characteristics. Examples of possible applications include TFT circuits to be used for display devices such as FED (Field Emission Diode) displays, DMDs (Digital Mirror Devices), LED (Light Emitting Diode) displays, EL (Electro-Luminescence) displays. Other examples include devices in which crystalline silicon TFTs are used, e.g., direct-contact type image sensors and flash memories.

(EXAMPLE 2)

In the present example, a TFT circuit will be described which includes circuitry which require high speed operation and high driving power and circuitry which require high retention characteristics. The former circuitry is composed of polycrystalline silicon TFTs (preferably with a crystallization-enhancing metal element being added to the polycrystalline silicon films) and have high carrier mobility. The latter circuitry is composed of amorphous silicon TFTs having only small leak currents.

FIG. 9 is a schematic diagram showing the configuration of an active matrix type liquid crystal display device 100 according to the present example. The active matrix type liquid crystal display device 100 includes a display section 101 for displaying images by using liquid crystal, a data signal line driving circuit 102 for driving source lines included in the display section 101, and a scanning signal line driving circuit 103 for controlling TFTs included in the display section 101. These constituent elements are formed on an insulating substrate 104.

First, the display section 101 will be described.

Figure 10:
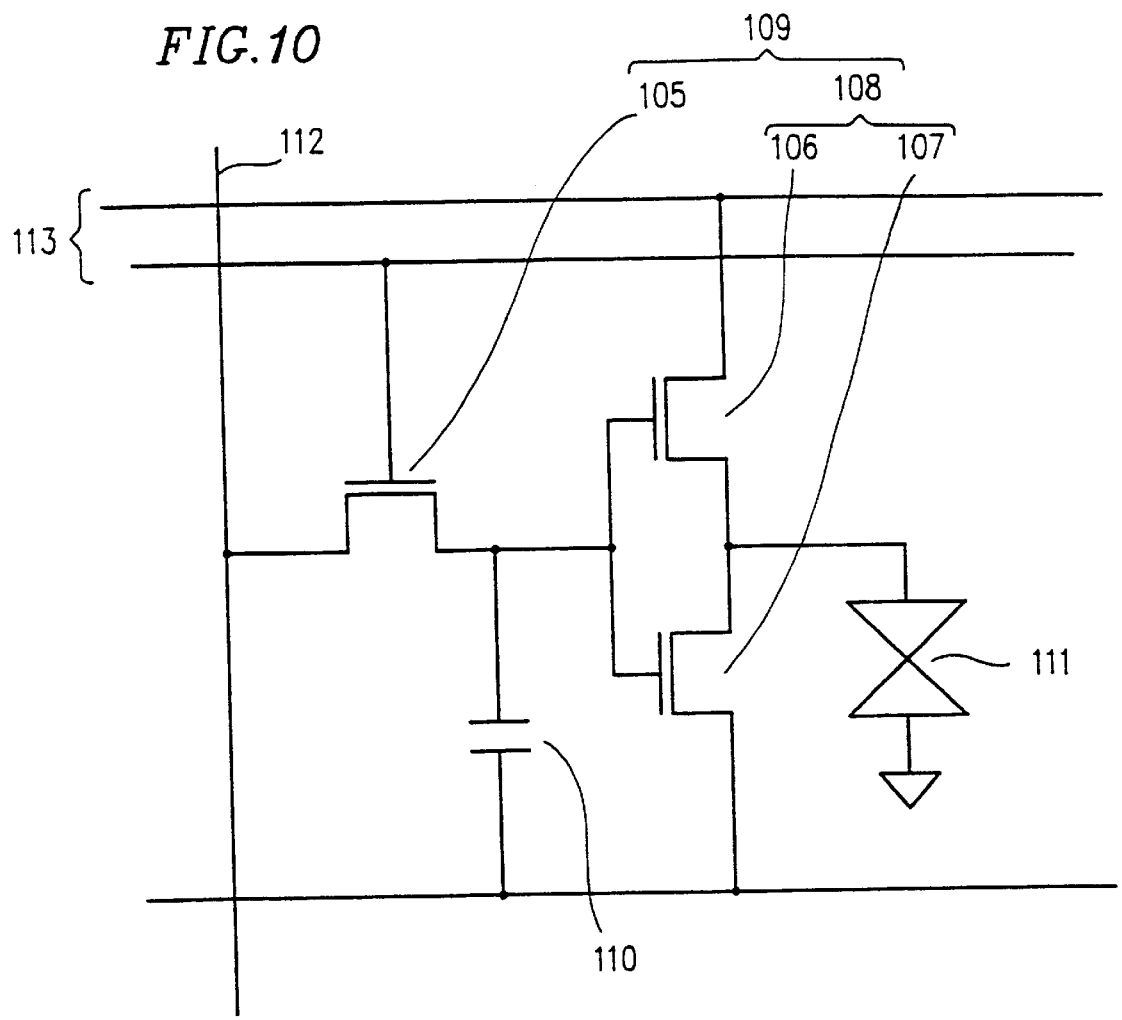
FIG. 10 is an equivalent circuit diagram showing an exemplary configuration for a pixel driving circuit corresponding to one pixel of a display section of the display device shown in FIG. 9.

FIG. 10 is an equivalent circuit diagram showing an exemplary pixel driving circuit corresponding to one pixel of the display section 101. The pixel driving circuit includes a sampling circuit 105 connected to a data signal line 112 and scanning signal lines 113, and a buffer circuit 108 connected to the sampling circuit 105. The sampling circuit 105 is composed of an amorphous silicon TFT. The buffer circuit 108 is composed of TFTs 106 and 107 of a CMOS structure, the TFTs 106 and 107 being composed of poly-crystalline silicon films. A pixel capacitance 111 is connected between the TFTs 106 and 107. A hold capacitance 110 is connected between the sampling circuit 105 and the buffer circuit 108. In general, the sample/hold circuit 109, functioning as the pixel driving circuit, is required to have only a small leak current so that given sampling pixel data, which is retained in a hold capacitance 110 in order to prevent the reduction in contrast of a displayed image, does not leak as a leak current via the sampling circuit 105. The buffer circuit 108 is required to have high driving power in order to compensate for loss of charges caused by the leak current which leaks via a leak resistance which the liquid crystal has, and to sufficiently drive a load capacitance consisting of the liquid crystal, which constitutes the pixel capacitance 111, the storage capacitance, and the like.

In the pixel driving circuit of the liquid crystal display device according to the present example, the sampling circuit 105 is composed of an amorphous silicon TFT, which has a-smaller off-current than that of a polycrystalline silicon TFT; whereas the buffer circuit 108, which is required to have high driving power, is composed of a polycrystalline silicon TFT, which has a higher driving power than that of an amorphous silicon TFT. Thus, a pixel driving circuit having a low leak current and high driving power can be realized. By realizing the sample/hold circuit 109 having the above configuration, it becomes possible to achieve high-quality display, with the display contrast being prevented from decreasing.

Next, the data signal line driving circuit 102 will be described.

Figure 11:
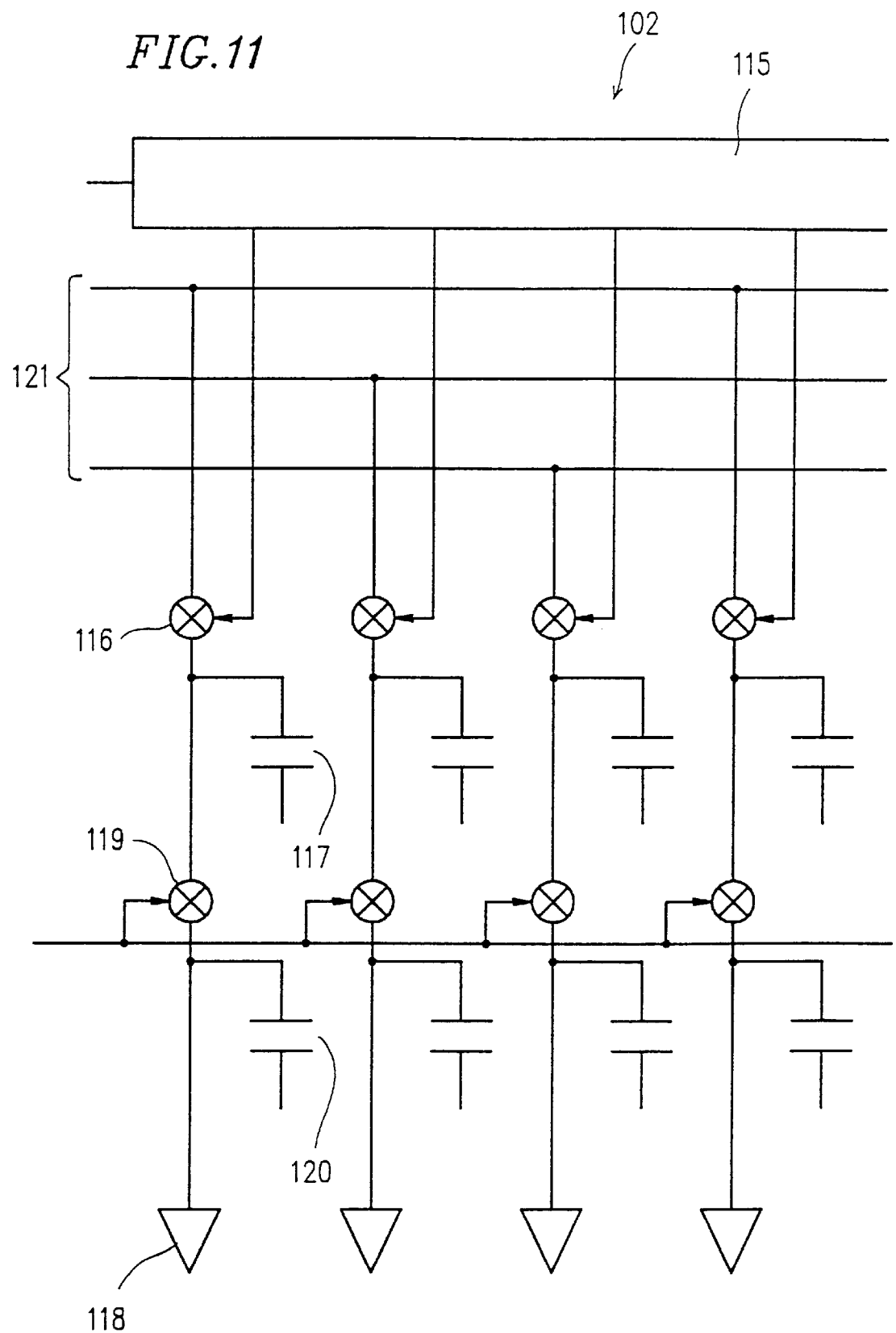
FIG. 11 is an equivalent circuit diagram showing an exemplary configuration for a line sequential sampling type data signal line driving circuit of the display device shown in FIG. 9.

FIG. 11 is an equivalent circuit diagram showing an exemplary configuration for a data signal line driving circuit of the liquid crystal display device according to the present example.

The data signal line driving circuit 102 is of a line sequential sampling type, which allows a sufficient writing time into the each pixel capacitance. The data signal line driving circuit 102 includes a scanning circuit 115 composed of shift registers and the like, buffers 118, and analog switches 116 and 119 provided between a data signal line 121 and the buffers 118. A hold capacitance 117 is connected between each pair of analog switches 116 and 119. A hold capacitance 120 is connected between each analog switch 119 and the corresponding buffer 118.

In accordance with an output signal from each stage of the scanning circuit 115, each analog switch 116 is opened/closed so that an image signal from the data signal line 121 is stored in the corresponding hold capacitance 117. The signal stored in the hold capacitance 117 is sent to the corresponding buffer 118 in accordance with the opening/timing of the corresponding analog switch 119. Accordingly, an image signal, which is provided on a time sequential basis, is sequentially sampled during one horizontal period in accordance with the signal from the scanning circuit 115 so as to be retained in the hold capacitance 117 in the data signal line driving circuit 102. A data signal corresponding to one (scanning) line is output to a source line via the corresponding buffer 118.

The data signal line driving circuit 102 is generally required to have a high operation speed, so that it is preferable to compose the data signal line driving circuit 102 of polycrystalline TFTs having large carrier mobility. However, it is preferable that the analog switches 116 and 119, which are connected to the hold capacitances 117 and 120, have only small leak currents, so that the analog switches 116 and 119 may be composed of amorphous silicon TFTs.

It is not preferable to apply the data signal line driving circuit shown in FIG. 12, which is of a dot sequential sampling type, to the present example for the following reason: The dot sequential sampling method allows only a short time for the writing into the pixel capacitances. Since amorphous silicon TFTs are used for the sampling circuits 105 shown in FIG. 10 of the pixel driving circuits according to the present example, the pixel capacitances cannot be sufficiently charged with the image signal.

The scanning signal line driving circuit 103 shown in FIG. 9 is not required to have as high an operation speed as that of the data signal line driving circuit 102. However, it is preferable to compose the scanning signal line driving circuit 103 of polycrystalline silicon TFTs, which have high carrier mobility. The scanning signal line driving circuit 103 has a simple construction with shift registers and buffer circuits.

Next, a method for producing TFT circuits according to the present example will be described.

According to the present example, an amorphous silicon film is formed on the entire surface of a substrate as a semiconductor film for forming a TFT. Next, a metal which enhances crystallization of amorphous silicon, e.g., nickel ("crystallization-enhancing metal element"), is selectively added to the vicinities of regions where component elements of those peripheral driving circuits which require high speed operation are to be disposed. Then, crystal growth is effected in a lateral direction, substantially in parallel to the substrate surface. In this process, the amorphous silicon is heated at a temperature which is not adequately high for the amorphous silicon to change into a polycrystalline silicon film without the addition of the above-mentioned metal element; thus, only the regions in which the metal element has been added is selectively changed into polycrystalline silicon.

As a result, the regions in which the TFTs of high speed operation-requiring peripheral driving circuits are to be disposed are transformed into a polycrystalline silicon film. The other regions, i.e., regions in which retention characteristics-requiring TFTs (i.e., TFTs which require low off-current characteristics rather than high speed operation) are to be disposed remain as an amorphous silicon film. Furthermore, the TFTs used for the above-mentioned peripheral driving circuits are produced in such a way that the direction of crystal growth of the polycrystalline silicon film is parallel to the direction in which carriers will move during operation of the TFTs.

Hereinafter, the production method will be described more specifically.

FIGS. 13A to 13D are cross-sectional views showing the method for producing the n-type TFT 105 used for the sampling circuit 109.

In the case where the analog switches 116 and 119 are to be composed of amorphous silicon TFTs, the TFTs can be of the same structure as that described below.

Figure 13A:
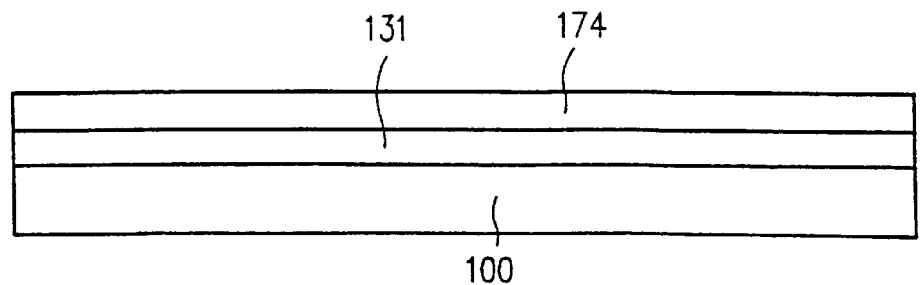
FIGS. 13A to 13D are cross-sectional views showing the structure and a method for producing a TFT included in a display section of a liquid crystal display device.
Figure 13B:
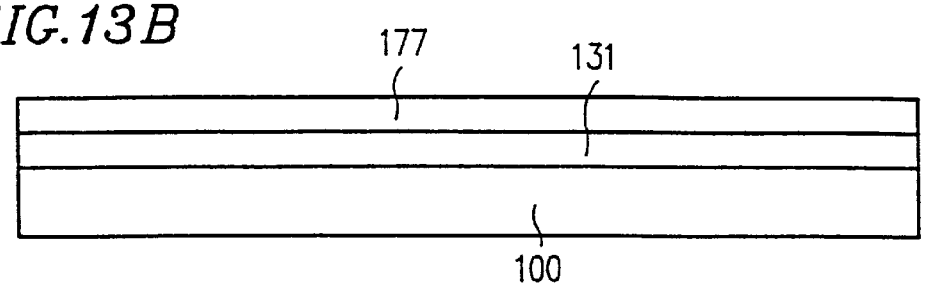
Figure 13C:
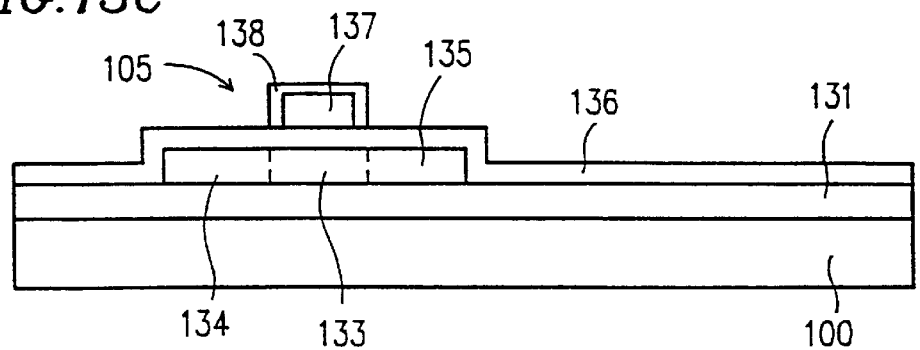
Figure 13D:
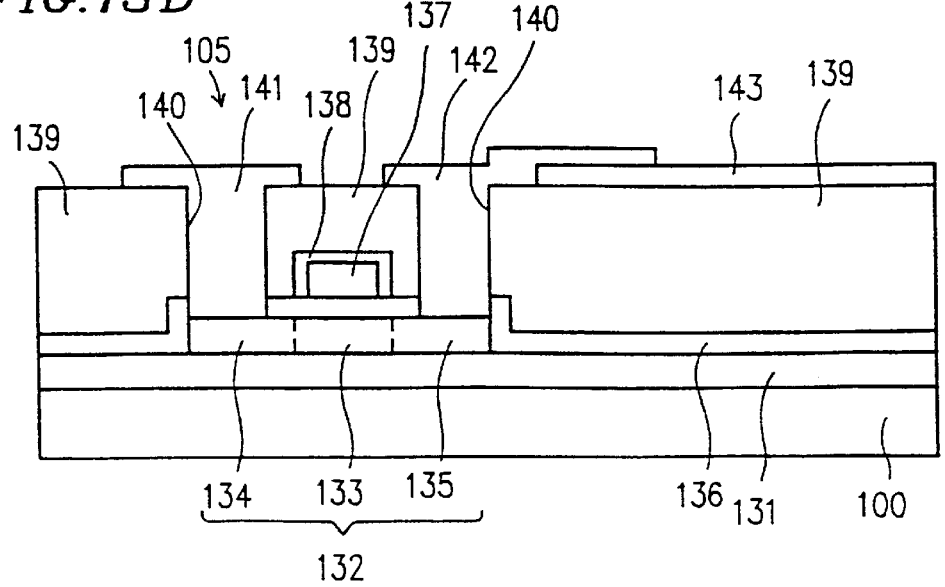

As shown in FIG. 13D, the TFT 105 is formed on a glass substrate (insulating substrate) 100 with an insulating film 131 (e.g., silicon oxide) interposed therebetween. An island-like amorphous silicon film 132 is formed on the insulating film 131. The amorphous silicon film 132 includes a channel region 133 and a source region 134 and a drain region 135, the channel region 133 being sandwiched between the source region 134 and the drain region 135. An aluminum gate electrode 137 is formed on the channel region 133 with a gate insulating film 136 interposed therebetween. The surface of the gate electrode 137 is covered with an oxide layer 138.

The entire surface of the TFT 105 is covered with an interlayer insulating film 139. Contact holes 140 to expose portions of the source region 134 and the drain region 135 are provided in the interlayer insulating film 139. The source region 134 and the drain region 135 are connected to electrode wires 141 and 142, respectively, via the contact holes 140. The electrode wire 142 is connected to a pixel electrode 143 provided on the interlayer insulating film 139.

FIGS. 14A to 14D are cross-sectional views illustrating the production method of the two TFTs 106 and 107 to be used for each buffer circuit 108, which requires high speed operation. The TFTs 106 and 107 are a p-type transistor and an n-type transistor, respectively, constituting a CMOS circuit. The scanning circuit 115 and each buffer 118 shown in FIG. 11 also include an n-type TFT or a p-type TFT having a similar structure.

Figure 14A:
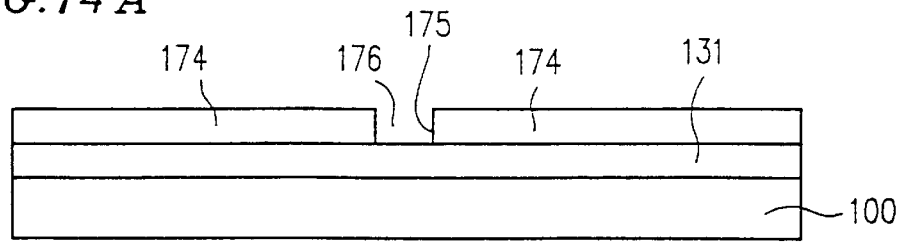
FIGS. 14A to 14D are cross-sectional views showing the structure and a method for producing a TFT of a CMOS structure included in a peripheral driving circuit for a liquid crystal display device.
Figure 14B:
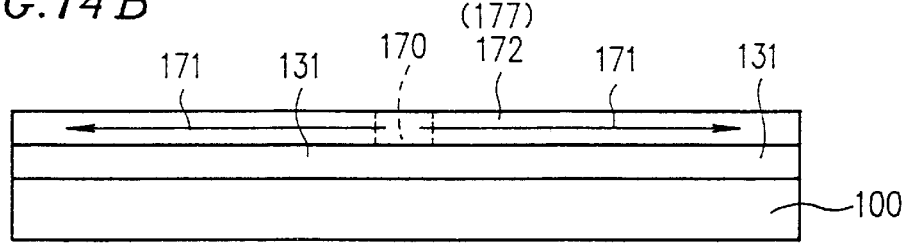
Figure 14C:
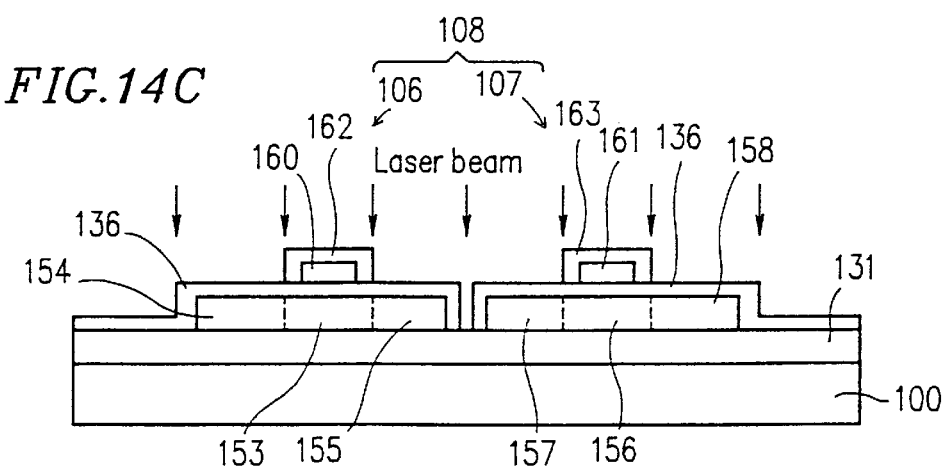
Figure 14D:
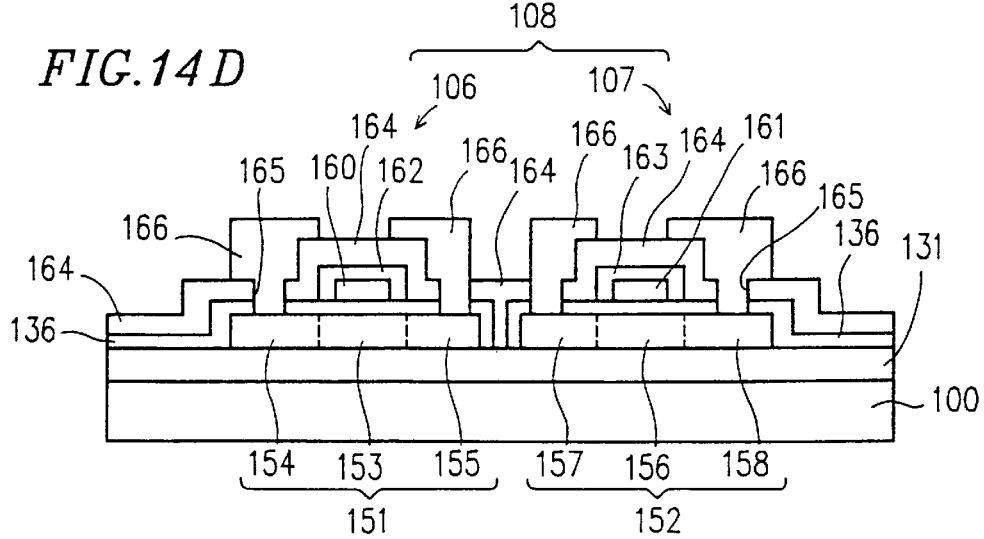
Figure 15:
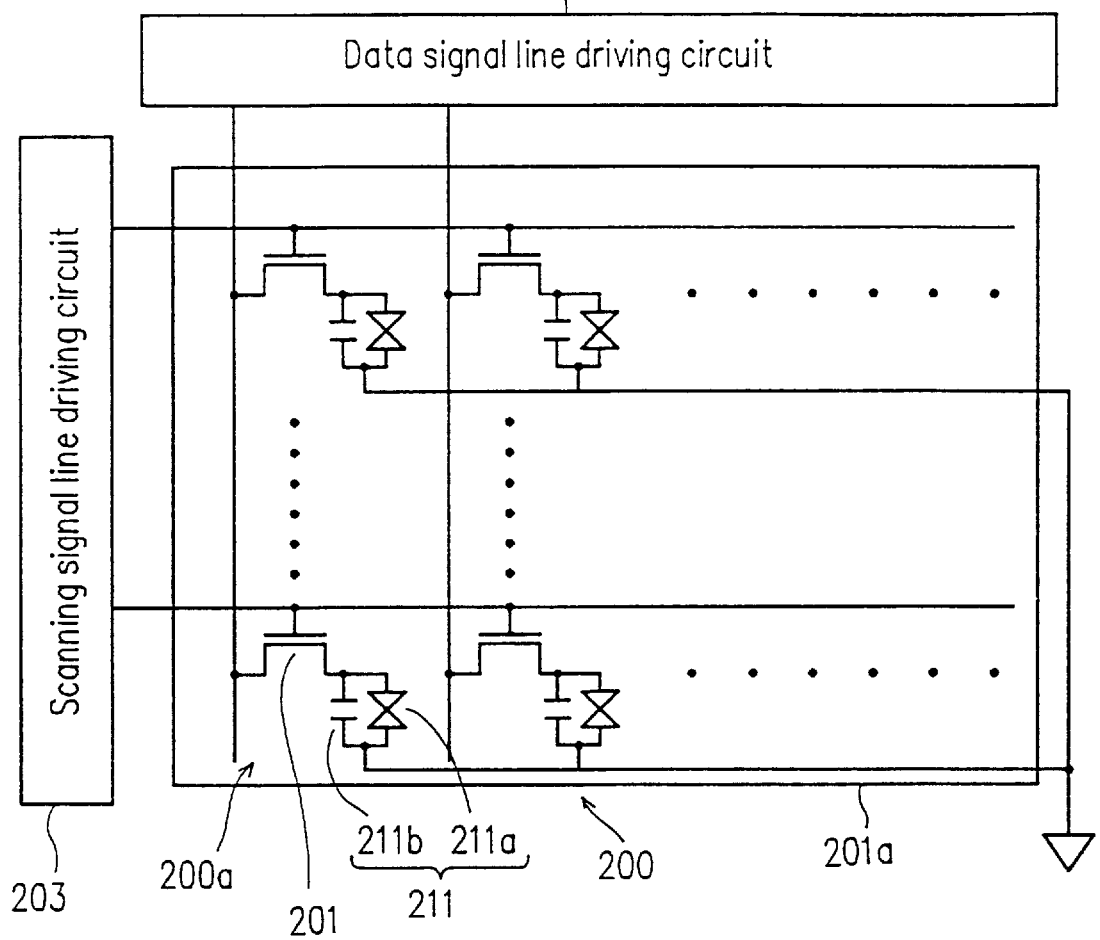
FIG. 15 is a diagram showing an exemplary configuration of a conventional active matrix type display device incorporating amorphous silicon TFTS.
Figure 16:
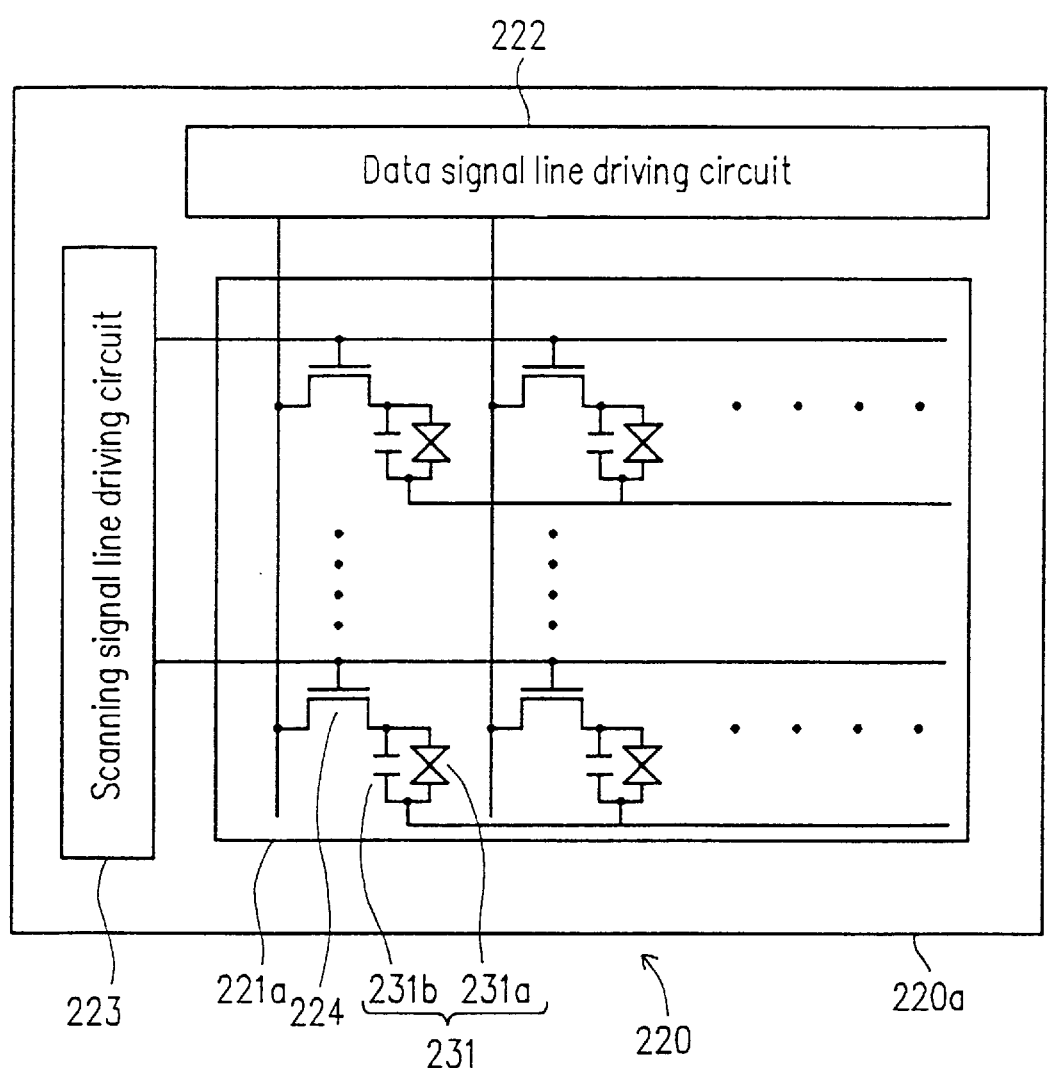
FIG. 16 is a diagram showing an exemplary configuration of a conventional active matrix type display device incorporating polycrystalline silicon TFTs.
Figure 17:
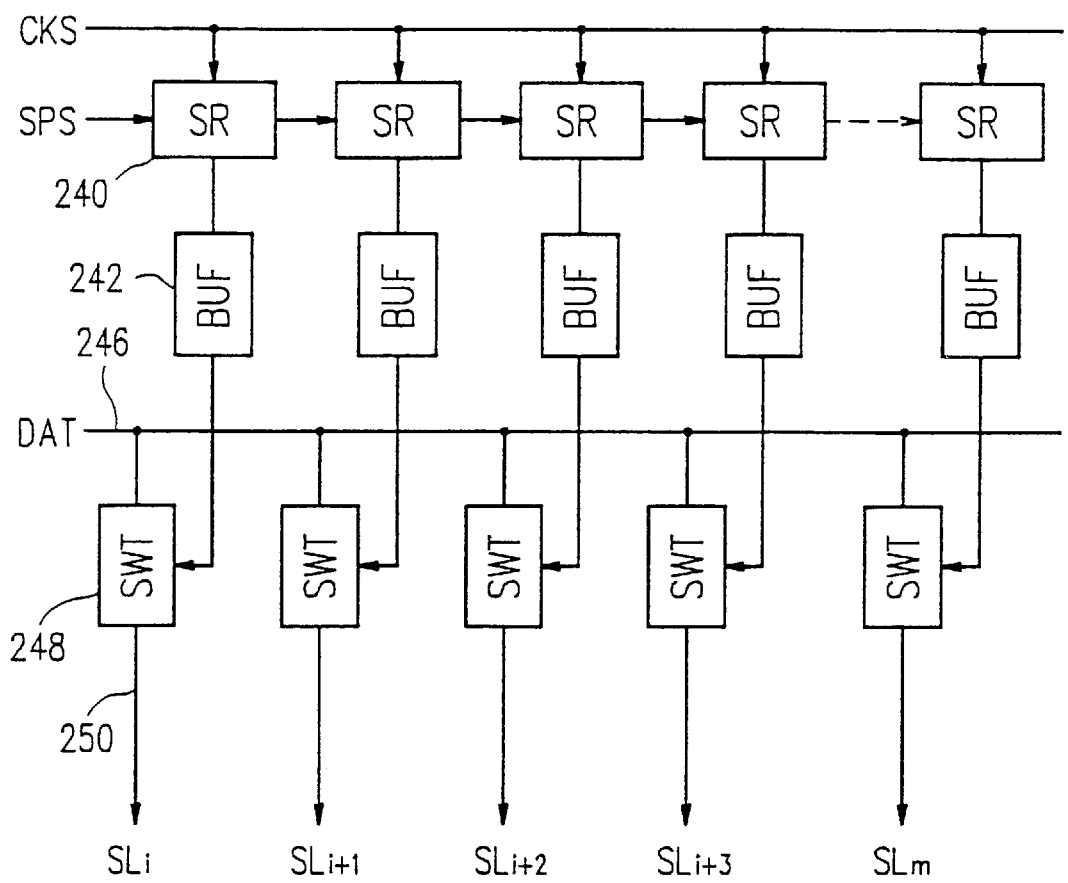
FIG. 17 is a block diagram showing a data signal line driving circuit of a conventional display device.
Figure 18:
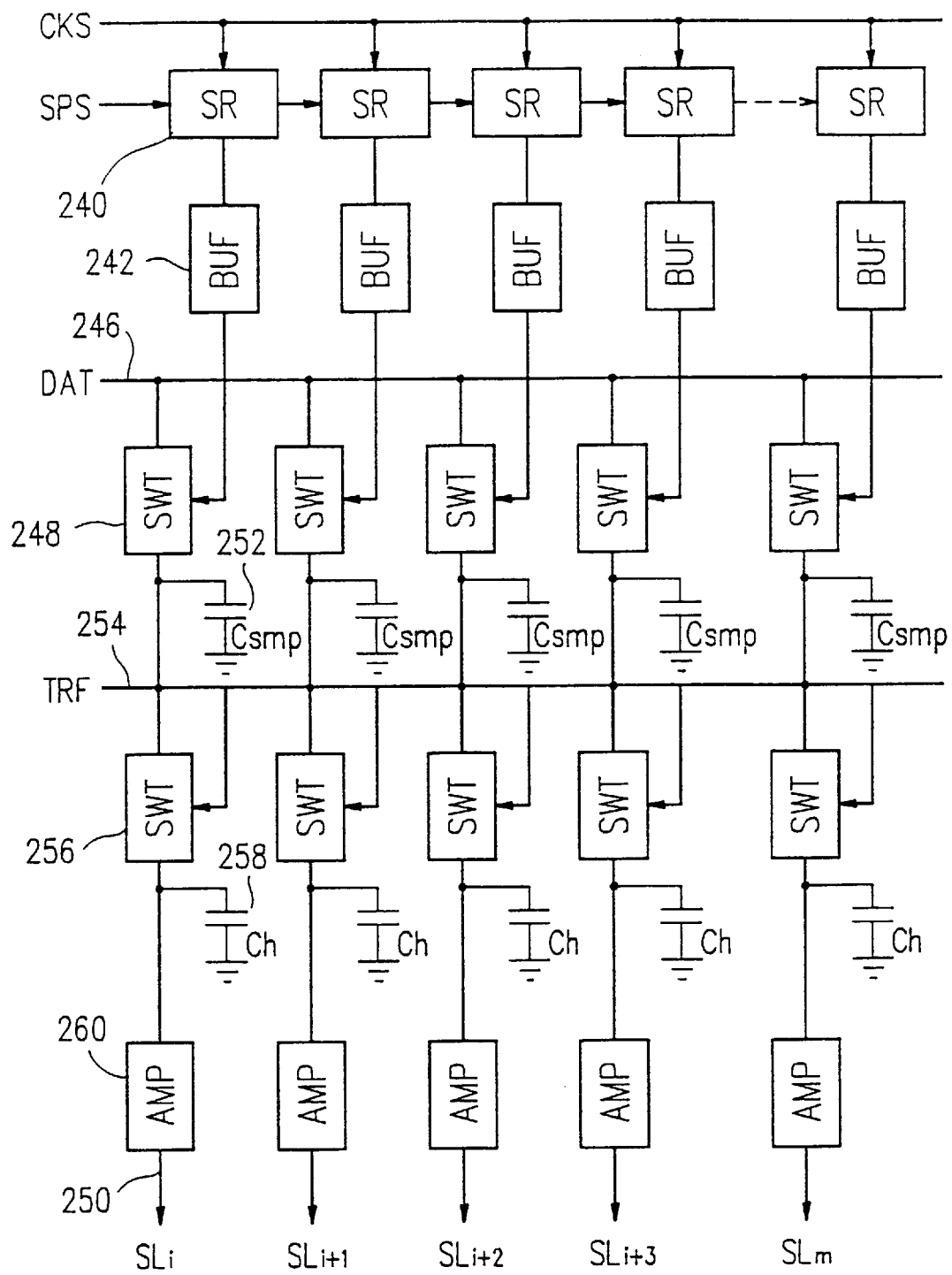
FIG. 18 is a block diagram showing another data signal line driving circuit of a conventional display device.

As shown in FIG. 14D, the TFTs 106 and 107 are formed on a glass substrate (insulating substrate) 100 with an insulating film 131 (e.g., silicon oxide) interposed therebetween. Island-like polycrystalline silicon films 151 and 152 are formed on the insulating film 131. The polycrystalline silicon film 151 includes a channel region 153 and a source region 154 and a drain region 155, the channel region 153 being sandwiched between the source region 154 and the drain region 155. The polycrystalline silicon film 152 includes a channel region 156 and a source region 157 and a drain region 158, the channel region 156 being sandwiched between the source region 157 and the drain region 158. Aluminum gate electrodes 160 and 161 are formed on the channel regions 153 and 156 with a gate insulating film 136 interposed therebetween. The surfaces of the gate electrodes 160 and 161 are respectively covered with oxide layers 162 and 163.

The entire surfaces of the TFTs 106 and 107 are covered with an interlayer insulating film 164. Contact holes 165 to expose portions of the source regions 154 and 157 and the drain regions 155 and 158 are provided in the interlayer insulating film 164. The source regions 154 and 157 and the drain regions 155 and 158 are connected to electrode wires 166 via the contact holes 165. In the present example, as shown in FIG. 14B, the polycrystalline silicon films 151 and 152 are portions of a lateral crystallization region 172, which results from crystal growth from a crystallized silicon region 170 (in the vicinities of the subsequent polycrystalline silicon films 151 and 152) in parallel directions 171 to the surface of the glass substrate 100.

The respective TFTs having the above configuration are produced as follows.

The TFT 105 shown in FIG. 13D and the TFTs 106 and 107 shown in FIG. 14D are to be formed on the same insulating substrate 100. Identical steps are performed simultaneously. Specifically, the steps shown in FIGS. 13A to 13D correspond to the steps shown in Figures 14A to 14D, respectively, illustrating steps to be performed at the same points of time.

First, the insulating film 131 (composed of a silicon oxide) having a thickness of 2000 angstroms is formed on the insulating substrate 100, which is a glass substrate such as Corning 7059 (a product name by Corning, Ltd.), by sputtering.

Next, a mask 174 (which is a metal mask or a silicon oxide film, etc.) is formed on the insulating film 131. The insulating film 131 is exposed in a slit where the mask 174 has an opening 175. In other words, if one views the state shown in FIG. 14A from above, the insulating film 131 is seen to be exposed in a region 176 and masked in the other regions.

After forming the mask 174, a nickel silicide film ($NiSi_x$, where $0.4 \leq x \leq 2.5$, e.g., 2.0) (not shown) is formed so as to have a thickness of 5 to 200 angstroms (e.g., 20 angstroms) on the mask 174 by sputtering.

Thereafter, the mask 174 is removed, leaving the nickel silicide film selectively formed in the region 176. In other words, a small amount of nickel has been added selectively in the region 176.

Next, an intrinsic-semiconductor amorphous silicon film 177 having a thickness of 500 to 1500 angstroms (e.g., 1000 angstroms) is formed by plasma CVD or reduced-pressure CVD. The amorphous silicon film 177 is crystallized by being annealed under a hydrogen reduced atmosphere (with the partial pressure of hydrogen preferably being in the range of 0.1 to 1 atm.) or an inert gas atmosphere (under the atmospheric pressure) at 550° C. for 4 hours. The annealing can be performed at a temperature of 450° C. However, it is preferably performed at a temperature in the range of 450° C. to 550° C. because excessive high temperature would disadvantageously transform the entire amorphous silicon film 177 into a polycrystalline silicon film.

In this process, the crystallization of the amorphous silicon film 177 in the region 176, where the nickel silicide film is selectively formed, occurs vertically with respect to the substrate 100. In regions surrounding the region 176, the crystal growth occurs laterally from the region 176 (i.e., in parallel directions 171 to the substrate 100). As is described later in the subsequent steps, the source and drain regions of TFTs of the peripheral driving circuits requiring high speed operation are formed so as to be aligned along the direction of crystal growth.

The crystal growth distance along the directions 171 parallel to the substrate 100 is on the order of several dozen μm (e.g., 40 μm).

By the above step, the amorphous silicon film 177 is polycrystallized, whereby the polycrystalline silicon film 172 is obtained. Then, isolation for each element is ensured, and unnecessary portions of the polycrystalline silicon film 172 are removed, thereby forming an element region. In this step, by prescribing the length of an active layer (a portion where a source region, a drain region, and a channel region are formed) to be within 40 μm, the active layer of the TFT can be all composed of the polycrystalline silicon film 172, as shown in FIGS. 14C and 14D. If at least the channel region is to be composed of the polycrystalline silicon film 172, the entire active layer can be prescribed to be longer than the above.

On the other hand, as shown in FIG. 13B, the amorphous silicon film 177 is not crystallized but remains as the amorphous silicon film 177 in the regions in which no nickel is added, or the regions away from the region in which nickel is added.

Thereafter, an silicon oxide film having a thickness of 1000 angstroms is formed as the gate insulating film 136 by sputtering. A silicon oxide is used as a target in the sputtering; the temperature of the substrate 100 is kept at 200° C. to 400° C. (e.g., 350° C.); a sputtering atmosphere of oxygen and argon is used, where the ratio of argon to oxygen (argon/oxygen) is in the range of 0 to 0.5 (e.g., 0.1).

Next, an aluminum film (containing 0.1 to 2% of silicon) having a thickness of 6000 to 8000 angstroms (e.g., 6000 angstroms) is formed by sputtering. It is preferable to perform the formation of the silicon oxide film and the aluminum film in a continuous manner.

Then, the aluminum film is patterned so as to form the gate electrode 137 shown in FIG. 13C and the gate electrodes 160 and 161 shown in FIG. 14C. It will be appreciated that the step of FIG. 13C and the step of FIG. 14C are simultaneously performed.

Furthermore, the surfaces of these aluminum electrodes 137, 160 and 161 are subjected to anodic oxidation, whereby oxide layers 138, 162, and 163 are formed on the respective electrodes. The anodic oxidation is performed in an ethylene glycol solution containing 1 to 5% of tartaric acid. The thicknesses of the resultant oxide layers 138, 162, and 163 are 2000 angstroms. The oxide layers 138, 162, and 163 define the length of an offset gate region in an ion doping step (to be described later), so that the length of the offset gate region can be determined in the above anodic oxidation step.

Next, impurities (phosphorus and boron) are implanted in the active region by ion implanting, using the gate electrodes 137, 160, and 161 and the oxide layers 138, 162, and 163 therearound as a mask. As the doping gas, phosphine ($PH_3$) or diborane ($B_2H_6$) is used. If phosphine is used, an acceleration voltage of 60 to 90 KV (e.g., 80 KV) is used. If diborane is used, an acceleration voltage of 40 to 80 KV (e.g., 65 KV) is used. The dose should be in the range of $8 \times 10^{15}$ to $10 \times 10^{15}$ cm$^{-2}$ (e.g., $2 \times 10^{15}$ cm$^{-2}$ of phosphorus, and $5 \times 10^{15}$ cm$^{-2}$ of boron).

The doping is selectively conducted with respect to each element by covering regions in which doping is unnecessary with a photoresist. As a result, the n-type impurity regions 134, 135, 157, and 158, ahd the p-type impurity regions 154 and 155 are formed, so that the p-channel type TFT 106 and the n-channel type TFT 107 are formed, as shown in FIG. 14C. At the same time, the n-channel type TFT 105 is formed, as shown in FIG. 13C.

Thereafter, annealing is effected by radiating a laser beam, thereby activating the ion-implanted impurities. A KrF excimer laser (wavelength: 248 nm; pulse width: 20 nsec) is used to provide the laser beam. However, other lasers can also be employed. The laser radiation is effected with an energy density of 200 to 400 mJ/cm$^2$ (e.g., 250 mJ/ cm$^2$), and 2 to 10 shoots are given per site (e.g., 2 pulses). It is useful to heat the substrate at 200° C. to 450° C. during the laser radiation.

In the above laser annealing step, nickel is diffused in the region 172 which has first been crystallized, so that the recrystallization is facilitated by the laser radiation. The impurity regions 154 and 155 doped with p type-inducing impurities and the impurity regions 157 and 158 doped with n type-inducing impurities can be easily activated.

Next, in the peripheral circuits, as shown in FIG. 14D, a silicon oxide film having a thickness of 6000 angstroms is formed as the interlayer insulating film 164 by plasma CVD. The contact holes 165 are made in the interlayer film 164, and the electrode wires 166 for the TFTs are formed of a multilayer film of a metal material, e.g., titanium aluminum nitride.

Moreover, in regions which require small off-currents, a silicon oxide film is formed as the interlayer insulating film 139 shown in FIG. 13D. After forming the contact holes 140, an ITO electrode to become the pixel electrode 143 is formed, and the metal wires 141 and 142 are formed. Finally, annealing is conducted under a hydrogen atmosphere (under 1 atm.) at 350° C. for 30 minutes. Thus, the TFTs or the TFT circuit is completed.

Thus, each pixel driving circuit in the display section of the active matrix type liquid crystal display device according to the present example includes a sample/hold circuit including a sampling circuit and a buffer circuit; the sampling circuit is composed of a sampling switch composed of an amorphous silicon TFT and a hold capacitor, whereas the buffer circuit has a CMOS structure composed of polycrystalline TFTs. Accordingly, the pixel driving circuit can have a large off-resistance and only a small leak current, as well as a high driving power, whereby high quality display can be achieved.

Since the peripheral driving circuitry which requires high speed operation, e.g., driving circuits, are composed of polycrystalline TFTs, it is possible to adopt a monolithic configuration for the peripheral circuitry and a display section, instead of externally providing driving LSIs.

Furthermore, the regions in which TFTs of the peripheral driving circuitry or the like are formed are composed of a polycrystalline silicon film obtained by crystal growth in directions parallel to the flow of carriers. Therefore, the carrier movement is free from influence of grain boundaries in the peripheral driving circuitry or the like requiring high speed operation, so that an even higher speed operation can be achieved.

Furthermore, the TFTs according to the present invention are produced by using polycrystalline silicon films obtained by selectively adding impurity metal elements, e.g., nickel, to amorphous silicon films. As a result, an apparatus including semiconductor devices which have high performance with little fluctuation over the entire substrate can be realized.

Although the above example described peripheral driving circuitry composed of polycrystalline silicon TFTS, the peripheral driving circuitry can also include amorphous silicon TFTs as well as polycrystalline silicon TFTs. In this case, amorphous silicon TFTs can be used as switch transistors, i.e., transistors which supply a signal that is input to one of a source terminal or a drain terminal thereof to a signal input terminal of another element as a voltage or a current via the other one of the source terminal or the drain terminal in accordance with a gate signal that is input to a gate terminal of the transistor. Thus, the peripheral driving circuitry can have a high off-resistance (i.e., small leak current).

Although the peripheral driving circuits such as the scanning signal line driving circuit and the data signal line driving circuit are described to include shift registers and buffer circuits, the peripheral driving circuits can include logic circuits, instead of the shift registers, which perform the same circuit operation. In this case, too, logic circuits and buffer circuits can be composed of polycrystalline silicon TFTs, whereby the operation speed and driving power of these circuits are improved. The pixel driving circuits can also include logic circuits composed of polycrystalline TFTs.

Thus, the present invention has been described by way of examples. However, the present invention admits a number of variants within the scope of the invention, other than TFT circuits including amorphous silicon TFTs and polycrystalline silicon TFTs described in the above examples.

Examples of possible applications of the present invention include, besides active matrix type substrates for liquid crystal displays, direct-contact type image sensors, driver-internalized thermal heads, driver-internalized optical writing devices or display devices incorporating organic type EL devices, etc. as light emitting elements, and three-dimensional ICs. An organic EL device is an electric filed light emission device incorporating an organic material as a light emitting material. By applying the present invention to these devices, the operation speed and/or resolution thereof can be enhanced. Furthermore, the present invention can be applied to, besides MOS type transistors described in the above examples, various semiconductor processes including bipolar transistors composed of polycrystalline semiconductors, static induction transistors, and the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active matrix type display device comprising:
   an insulating substrate;
   a plurality of pixels arranged in a matrix on the insulating substrate; and
   a data signal line driving circuit formed on the insulating substrate, the data signal line driving circuit driving the plurality of pixels,
   wherein the data signal line driving circuit includes
      a sample/hold circuit including a first transistor having a channel region comprising a polycrystalline silicon film to which a metal element for enhancing crystallization is added, and
      a circuit including a second transistor having a channel region comprising a polycrystalline silicon film to which no metal element for enhancing crystallization is added.

2. An active matrix type display device comprising:
   an insulating substrate;
   a plurality of pixels arranged in a matrix on the insulating substrate; and
   at least one of a data signal line driving circuit and a scanning signal line driving circuit formed on the insulating substrate for driving the plurality of pixels,
   wherein the at least one of the data signal line driving circuit and the scanning signal line driving circuit includes
      a sample/hold circuit including a first transistor having a channel region comprising a polycrystalline silicon film to which a metal element for enhancing crystallization is added, and
      a circuit including a second transistor having a channel region comprising a polycrystalline silicon film to which no metal element for enhancing crystallization is added.

3. The active matrix type display device according to claim 1, wherein the metal element for enhancing crystallization includes at least one selected from the group consisting of nickel (Ni), iron (Fe), cobalt (Co), palladium (Pd), and platinum (Pt).

4. A semiconductor device comprising a plurality of driving circuits for driving pixels of an active matrix type display device, the driving circuit being formed on an insulating substrate,
   wherein each of the plurality of pixel driving circuits includes a plurality of TFTs including at least a TFT consisting essentially of an amorphous silicon film and at least a TFT consisting essentially of a polycrystalline silicon film, the amorphous silicon film and the polycrystalline silicon film being formed on the insulating substrate.

5. The semiconductor device according to claim 4, wherein the TFT consisting essentially of an amorphous silicon film supplies a signal that is input to one of a source terminal or a drain terminal of the TFT to a signal input terminal of another element as a voltage or a current via the other one of the source terminal or the drain terminal in accordance with a gate signal that is input to a gate terminal of the TFT.

6. The semiconductor device according to claim 4, wherein each of the plurality of driving circuits includes a logic circuit and a buffer circuit, the logic circuit and buffer circuit including the TFT consisting essentially of a polycrystalline silicon film.

7. The semiconductor device according to claim 4 wherein each of the plurality of pixel driving circuits comprises a sample/hold circuit which has a sampling circuit including the TFT consisting essentially of an amorphous silicon film and a buffer circuit including the TFT consisting essentially of a polycrystalline silicon film, and
   wherein the TFT consisting essentially of an amorphous silicon film receives an image signal via one of a source terminal or a drain terminal thereof, and
   the other one of the source terminal or the drain terminal is coupled to a signal input terminal of the buffer and a capacitance for retaining the image signal.

8. The semiconductor device according to claim 4, wherein the polycrystalline silicon film is obtained by selectively introducing a metal element into a portion of an amorphous silicon film and allowing crystal to grow from the portion in directions substantially parallel to a surface of the insulating substrate by heating.

9. The semiconductor device according to claim 8, wherein the TFT consisting essentially of the polycrystalline silicon film is formed in such a manner that the directions in which the crystal grows are substantially parallel to a direction in which carriers in the polycrystalline silicon film move.

10. The semiconductor device according to claim 8, wherein the metal element for enhancing crystallization includes at least one selected from the group consisting of nickel (Ni), iron (Fe), cobalt (Co), palladium (Pd), and platinum (Pt).

11. The semiconductor device according to claim 4, the semiconductor device being included in an active matrix type liquid crystal display device.

12. A semiconductor device comprising a peripheral driving circuit for supplying a signal to a display section of an active matrix type display device, the peripheral driving circuit being formed on an insulating substrate,
   wherein the peripheral driving circuit includes a plurality of TFTs including at least a TFT consisting essentially of an amorphous silicon film and at least a TFT consisting essentially of a polycrystalline silicon film, the amorphous silicon film and the polycrystalline silicon film being formed on the insulating substrate.

13. The semiconductor device according to claim 12, wherein the TFT consisting essentially of an amorphous silicon film supplies a signal that is input to one of a source terminal or a drain terminal of the TFT to a signal input terminal of another element as a voltage or a current-via the other one of the source terminal or the drain terminal in accordance with a gate signal that is input to a gate terminal of the TFT.

14. The semiconductor device according to claim 12, wherein the driving circuit includes a logic circuit and a buffer circuit, the logic circuit and buffer circuit including the TFT consisting essentially of a polycrystalline silicon film.

15. The semiconductor device according to claim 12, wherein the peripheral driving circuit comprises a data signal line driving circuit which has a scanning circuit including the TFT consisting essentially of a polycrystalline silicon film and an analog switch including the TFT consisting essentially of an amorphous silicon film, and the TFT consisting essentially of the amorphous silicon film receives an image signal via one of a source terminal or a drain terminal thereof, the other one of the source terminal or the drain terminal being coupled to a capacitance for retaining the image signal.

16. The semiconductor device according to claim 12, wherein the polycrystalline silicon film is obtained by selectively introducing a metal element into a portion of an amorphous silicon film and allowing crystal to grow from the portion in directions substantially parallel to a surface of the insulating substrate by heating.

17. The semiconductor device according to claim 16, wherein the TFT consisting essentially of the polycrystalline silicon film is formed in such a manner that the directions in which the crystal grows are substantially parallel to a direction in which carriers in the polycrystalline silicon film move.

18. The semiconductor device according to claim 16, wherein the metal element for enhancing crystallization includes at least one selected from the group consisting of nickel (Ni), iron (Fe), cobalt (Co), palladium (Pd), and platinum (Pt).

19. The semiconductor device according to claim 12, the semiconductor device being included in an active matrix type liquid crystal display device.

* * * * *